United States Patent
Abe

(10) Patent No.: US 9,389,291 B2
(45) Date of Patent: Jul. 12, 2016

(54) GRADIENT COIL, MAGNETIC RESONANCE IMAGING DEVICE, AND METHOD FOR DESIGNING COIL PATTERN

(75) Inventor: Mitsushi Abe, Hitachinaka (JP)

(73) Assignee: Hitachi Medical Corporation, Tokyo (JP)

( * ) Notice: Subject to any disclaimer, the term of this patent is extended or adjusted under 35 U.S.C. 154(b) by 873 days.

(21) Appl. No.: 13/511,820

(22) PCT Filed: Nov. 26, 2010

(86) PCT No.: PCT/JP2010/071080
§ 371 (c)(1),
(2), (4) Date: May 24, 2012

(87) PCT Pub. No.: WO2011/065455
PCT Pub. Date: Jun. 3, 2011

(65) Prior Publication Data
US 2012/0235685 A1    Sep. 20, 2012

(30) Foreign Application Priority Data
Nov. 27, 2009 (JP) ................................ 2009-269619

(51) Int. Cl.
*G01R 33/385* (2006.01)
*G01R 33/20* (2006.01)
(Continued)

(52) U.S. Cl.
CPC .............. *G01R 33/385* (2013.01); *G01R 33/20* (2013.01); *G01R 33/4215* (2013.01); *G01R 33/56518* (2013.01)

(58) Field of Classification Search
CPC .. G01R 33/20; G01R 33/385; G01R 33/4215; G01R 33/56518
See application file for complete search history.

(56) References Cited

U.S. PATENT DOCUMENTS 4,733,189 A * 3/1988 Punchard ........... G01R 33/4215
324/318
4,737,716 A * 4/1988 Roemer ............. G01R 33/4215
324/318
(Continued)

FOREIGN PATENT DOCUMENTS

CN        1875288 A     12/2006
CN      101191829 A      6/2008
(Continued)

OTHER PUBLICATIONS

Chinese Office Action received in Chinese Application No. 201080053503.5 dated Mar. 13, 2014.
(Continued)

*Primary Examiner* — Dixomara Vargas
(74) *Attorney, Agent, or Firm* — Mattingly & Malur, PC

(57) ABSTRACT

A method for designing a coil pattern, whereby the production of an error magnetic field and further an eddy current can be suppressed to improve the quality of a cross-sectional image irrespective of cylindrical cross-sectional shape of the main coil and the shield coil. The difference between the initial values of the target magnetic field and the magnetic field vector is set as a difference target magnetic field. An approximate value of the current potential vector that produces the difference target magnetic field is represented by a polynomial of an eigenvector group of the current potential. The coefficient of each of the terms of the polynomial is determined on the basis of the singular value and the eigenvector group of the magnetic field distribution.

7 Claims, 19 Drawing Sheets

(51) Int. Cl.
*G01R 33/421* (2006.01)
*G01R 33/565* (2006.01)

(56) References Cited

U.S. PATENT DOCUMENTS

| | | | | |
|---|---|---|---|---|
| 4,871,969 | A * | 10/1989 | Roemer | G01R 33/422 324/300 |
| 5,084,676 | A * | 1/1992 | Saho | G01R 33/3854 324/318 |
| 5,111,147 | A | 5/1992 | Aubert | |
| 5,132,618 | A * | 7/1992 | Sugimoto | G01R 33/3815 324/318 |
| 5,177,441 | A * | 1/1993 | Morich et al. | 324/318 |
| 5,289,128 | A * | 2/1994 | DeMeester | G01R 33/385 324/318 |
| 5,311,135 | A * | 5/1994 | Vavrek | G01R 33/385 324/318 |
| 5,381,093 | A * | 1/1995 | Kawamoto | G01R 33/34046 324/318 |
| 5,424,643 | A * | 6/1995 | Morich | G01R 33/34 324/318 |
| 5,512,828 | A | 4/1996 | Pausch et al. | |
| 5,939,882 | A | 8/1999 | Gebhardt et al. | |
| 6,262,576 | B1 * | 7/2001 | Petropoulos | G01R 33/385 324/318 |
| 6,437,567 | B1 * | 8/2002 | Schenck | G01R 33/34061 324/318 |
| 6,448,774 | B1 * | 9/2002 | Heid | 324/318 |
| 6,462,636 | B1 | 10/2002 | Overweg et al. | |
| 6,479,998 | B1 * | 11/2002 | Yui | G01R 33/4215 324/318 |
| 6,504,370 | B2 * | 1/2003 | Heid | G01R 33/4215 324/318 |
| 6,618,606 | B2 * | 9/2003 | Overweg | G01R 33/3806 324/318 |
| 6,933,722 | B2 * | 8/2005 | Tsuda | G01R 33/3806 324/318 |
| 7,030,611 | B2 * | 4/2006 | Sakakura | G01R 33/385 324/309 |
| 7,276,906 | B2 | 10/2007 | Shvartsman et al. | |
| 7,282,916 | B2 * | 10/2007 | Eberlein | G01R 33/385 324/318 |
| 7,576,540 | B2 * | 8/2009 | Abe | G01R 33/4215 324/318 |
| 7,642,780 | B2 * | 1/2010 | Diehl | G01R 33/34046 324/318 |
| 7,755,357 | B2 * | 7/2010 | Holle | G01R 33/34046 324/318 |
| 7,825,663 | B2 * | 11/2010 | Sakakura | G01R 33/385 324/318 |
| 7,932,722 | B2 * | 4/2011 | Amm | G01R 33/385 324/309 |
| 8,212,564 | B2 * | 7/2012 | Tsuda | G01R 33/3806 324/318 |
| 8,323,768 | B2 * | 12/2012 | Connelly | G01R 33/285 174/392 |
| 8,378,681 | B2 * | 2/2013 | Taracila | G01R 33/3685 324/318 |
| 8,552,726 | B2 * | 10/2013 | Sakakura | G01R 33/3854 324/318 |
| 8,587,313 | B2 * | 11/2013 | Imamura | G01R 33/385 324/318 |
| 8,598,879 | B2 * | 12/2013 | Sakakura | A61B 5/015 324/315 |
| 8,633,698 | B2 * | 1/2014 | Abe | A61B 5/055 324/318 |
| 8,736,266 | B2 * | 5/2014 | Sakakura | G01R 33/3856 324/318 |
| 8,766,632 | B2 * | 7/2014 | Biber | G01R 33/422 324/307 |
| 8,896,308 | B2 * | 11/2014 | Shvartsman | G01R 33/385 324/318 |
| 8,991,036 | B2 * | 3/2015 | Fath | G01R 33/3858 29/593 |
| 9,013,185 | B2 * | 4/2015 | Brown | G01R 33/422 324/309 |
| 9,075,119 | B2 * | 7/2015 | Terada | G01R 33/385 |
| 9,098,672 | B2 * | 8/2015 | Diehl | G01R 33/422 |
| 9,116,215 | B2 * | 8/2015 | Boskamp | G01R 33/0076 |
| 2006/0033496 | A1 | 2/2006 | Shvartsman et al. | |

FOREIGN PATENT DOCUMENTS

| | | |
|---|---|---|
| JP | 2-502070 A | 7/1990 |
| JP | 02-261427 A | 10/1990 |
| JP | 3-56409 U | 5/1991 |
| JP | 08-038457 A | 2/1996 |
| JP | 10-179552 A | 7/1998 |
| JP | 2011-112737 A | 4/2001 |
| JP | 2001-170026 A | 6/2001 |
| JP | 2001-327478 A | 11/2001 |
| JP | 2006-506155 A | 2/2006 |
| JP | 2007-175438 A | 7/2007 |
| WO | 2004/046745 A1 | 6/2004 |
| WO | 2008/122899 A1 | 10/2008 |

OTHER PUBLICATIONS

M. Abe, "An electromagnetic design tool DUCAS improvement for MRI gradient coils", Energy and environmental systems lab, 7-2-1 Omika-cho, Hitachi-shi, Ibaraki, 319-1221, May 20, 2009, pp. 261-264.

* cited by examiner

FIG.10
(a) MAIN COIL
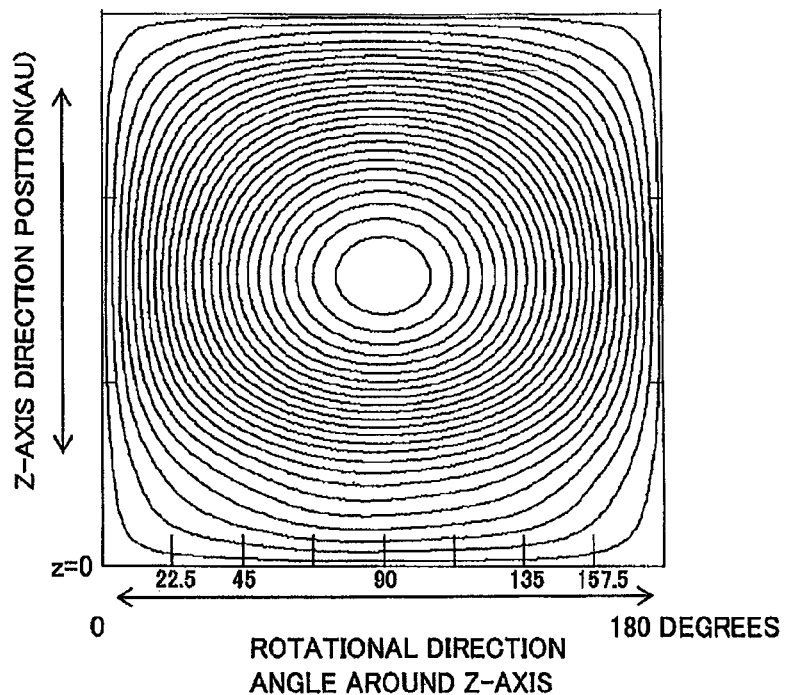
(b) SHIELD COIL
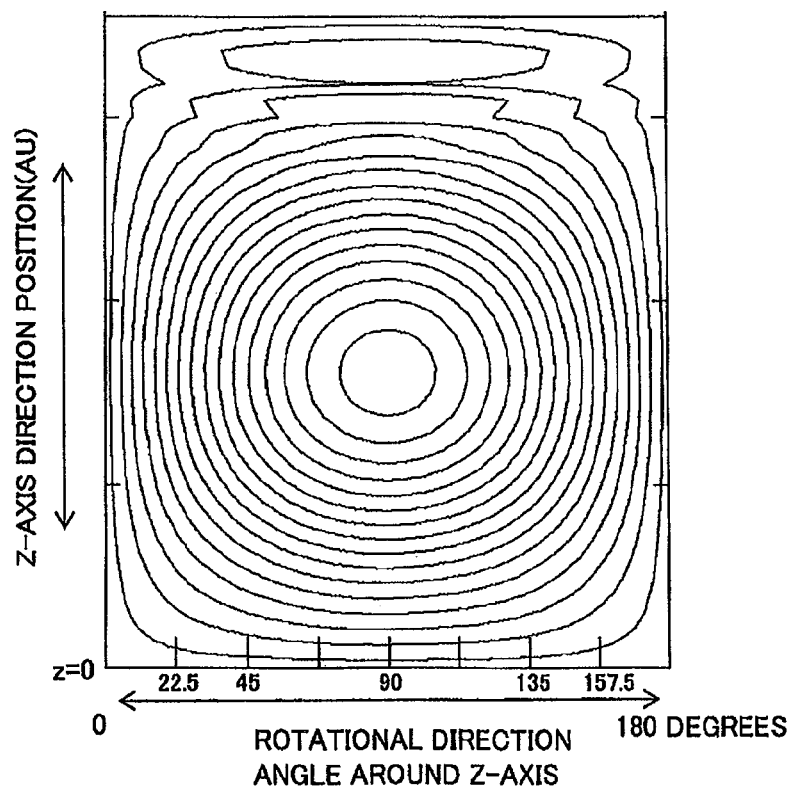

FIG. 12
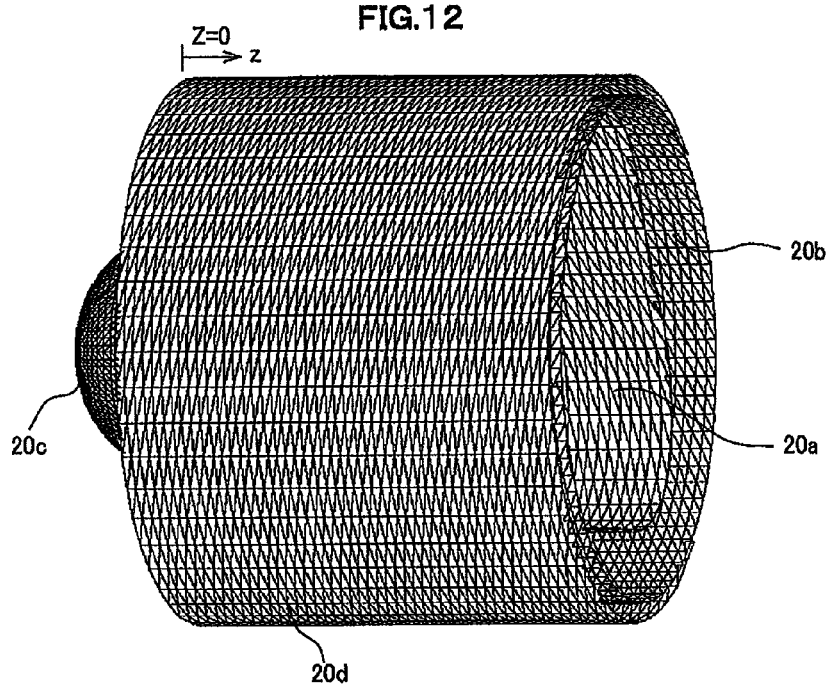
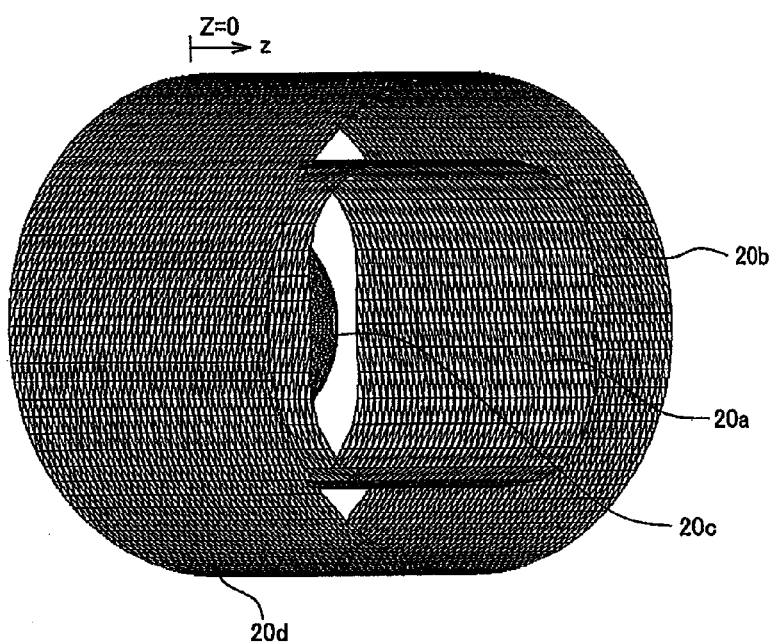

FIG. 13
(a) MAIN COIL
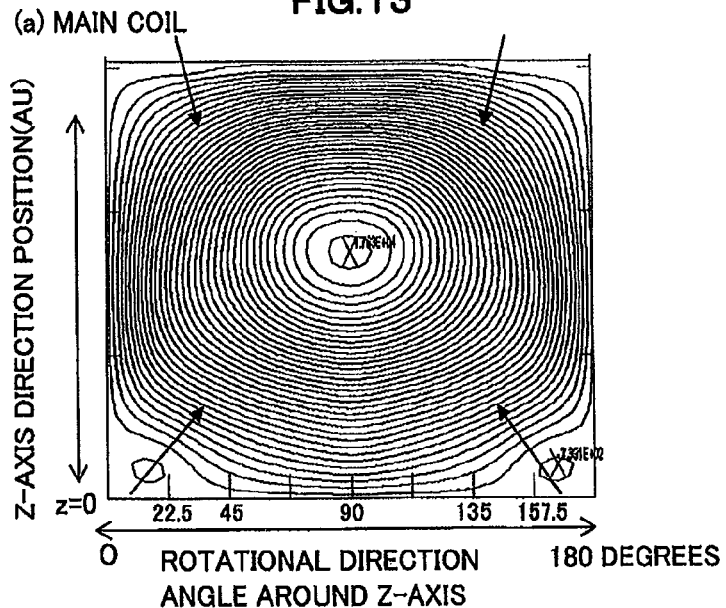
(b) SHIELD COIL
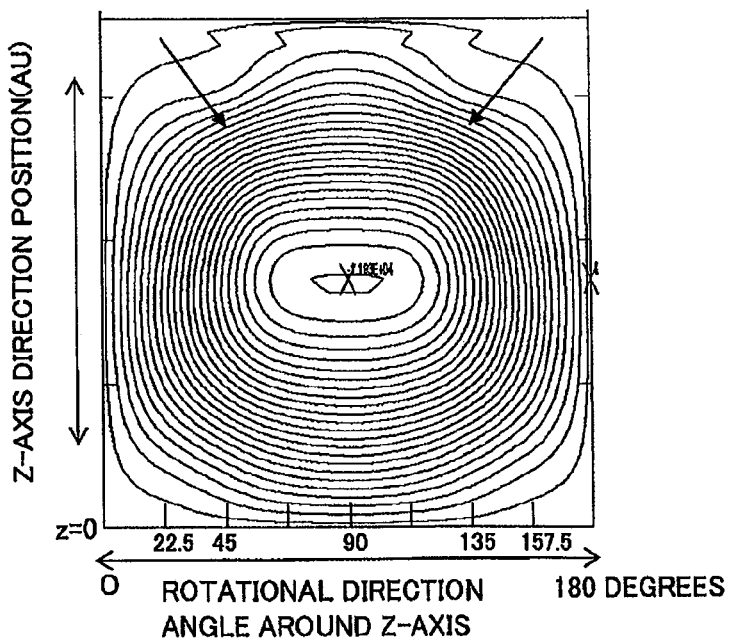
(c)
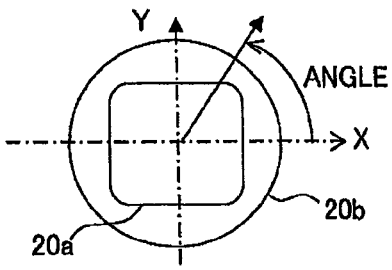

FIG.14
(a)
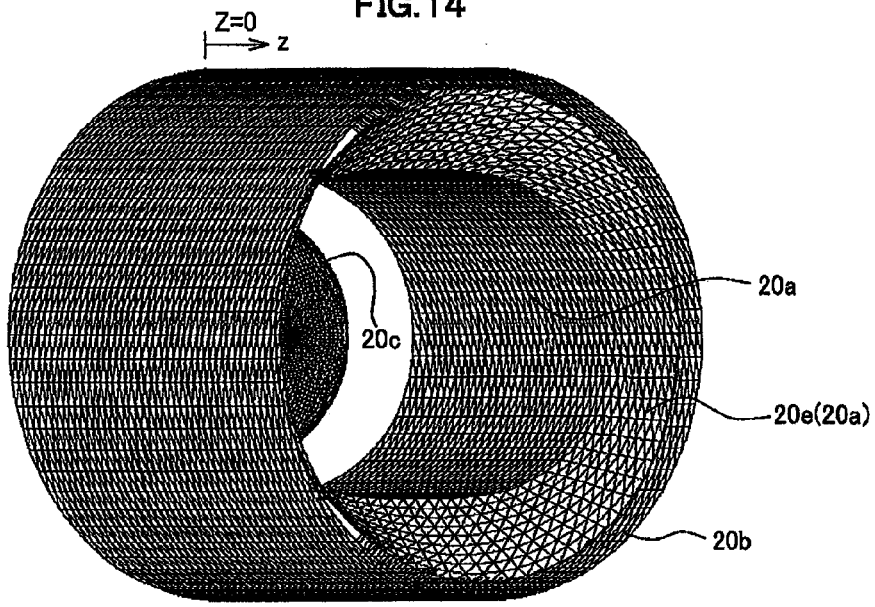
FINITE ELEMENT MODEL USING SYMMETRY CONDITION ON Z>0 SIDE
(b)
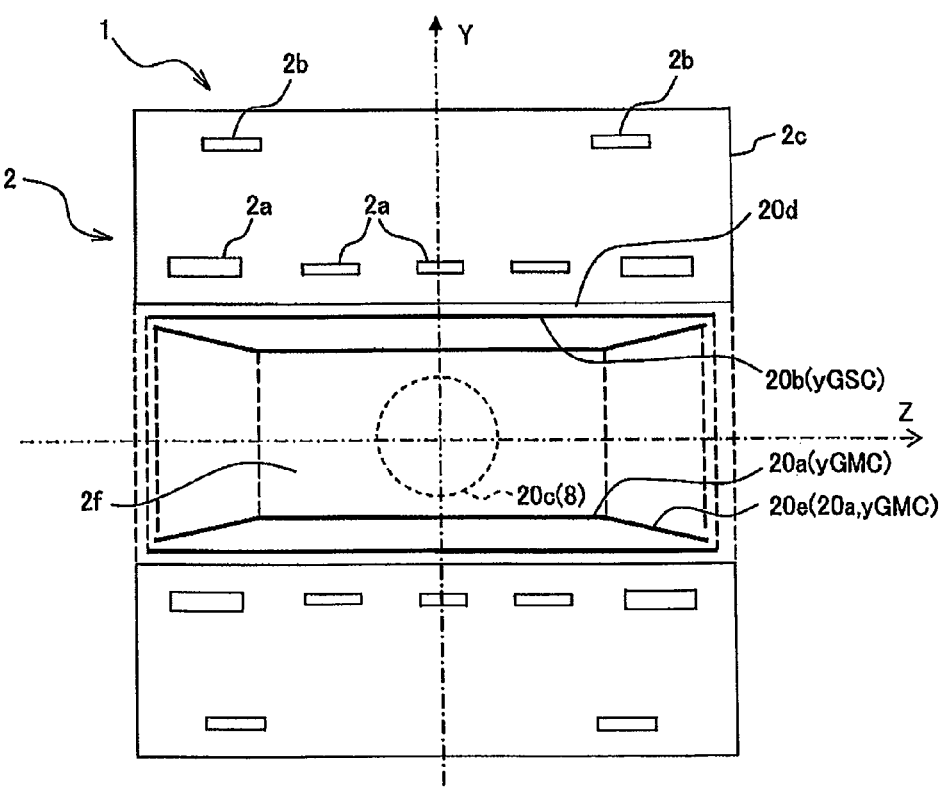

FIG. 15
(a) MAIN COIL
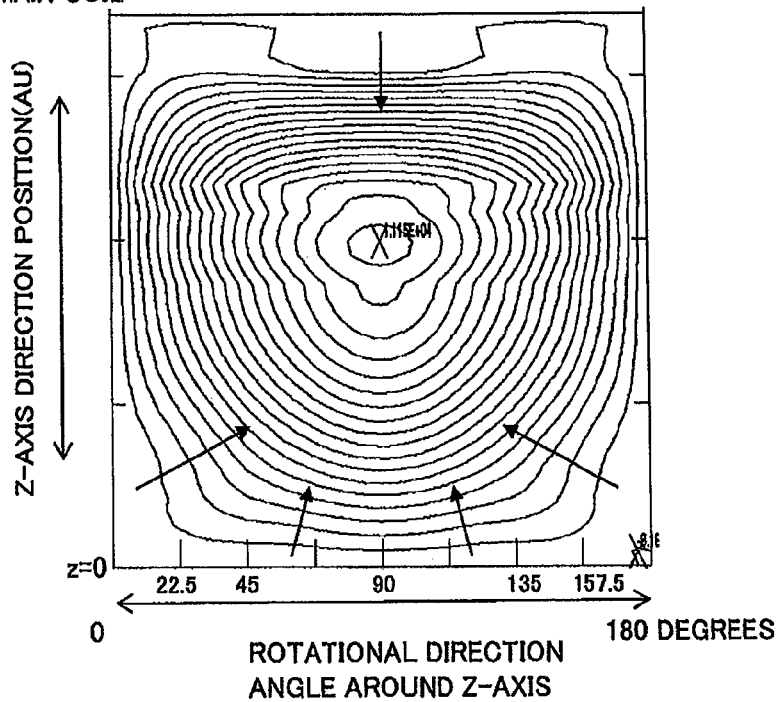
(b) SHIELD COIL
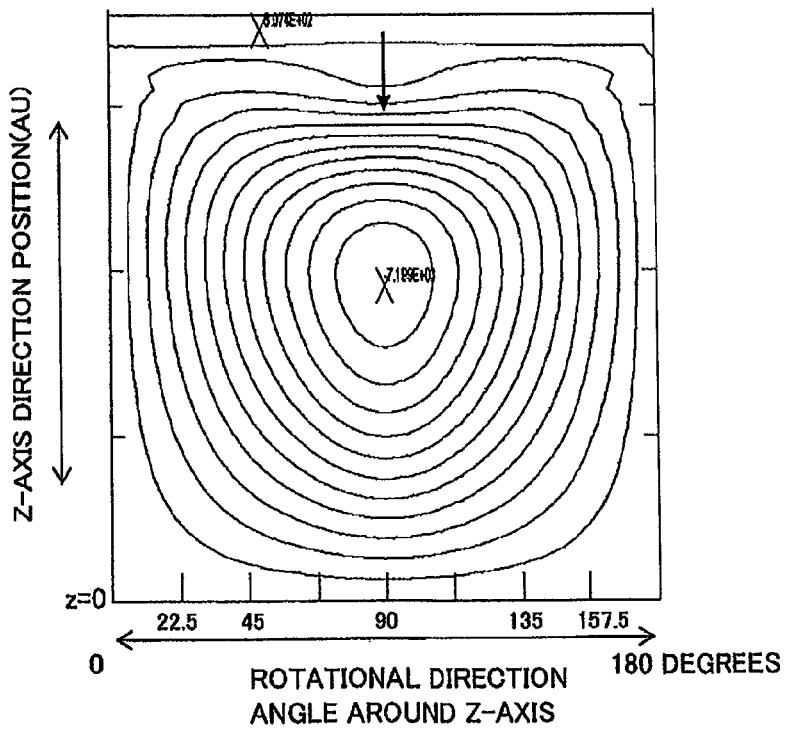

FIG.16
(a)
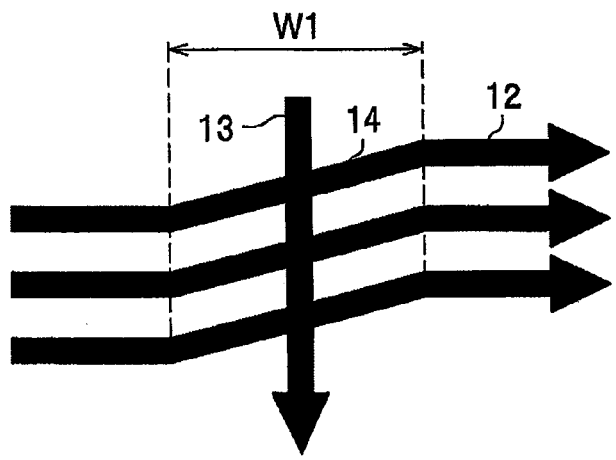
(b)
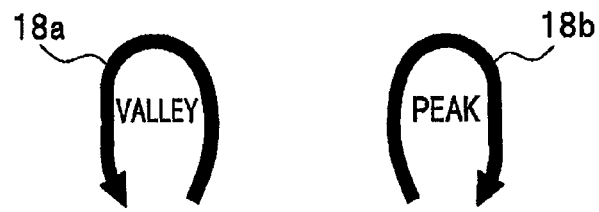
(c)
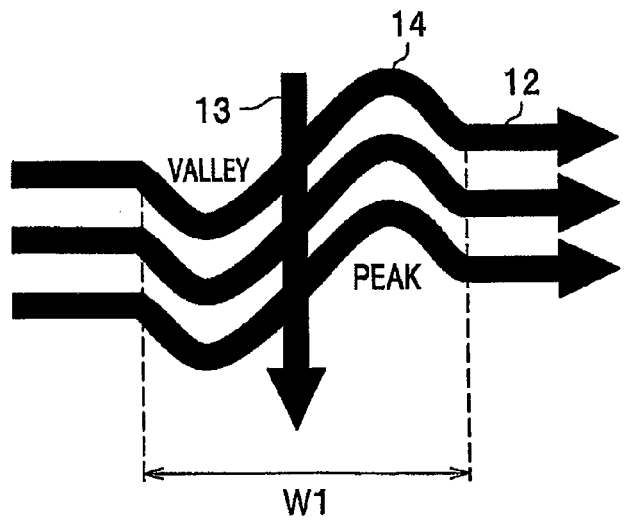

FIG.17
(a)
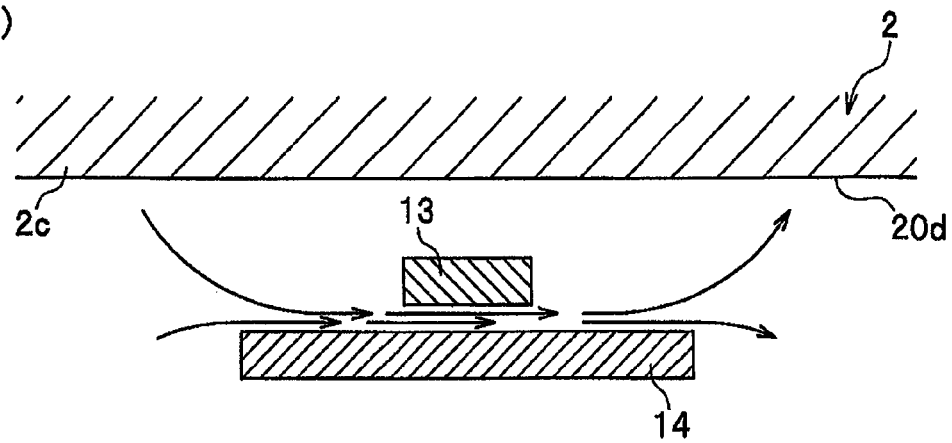
(b)
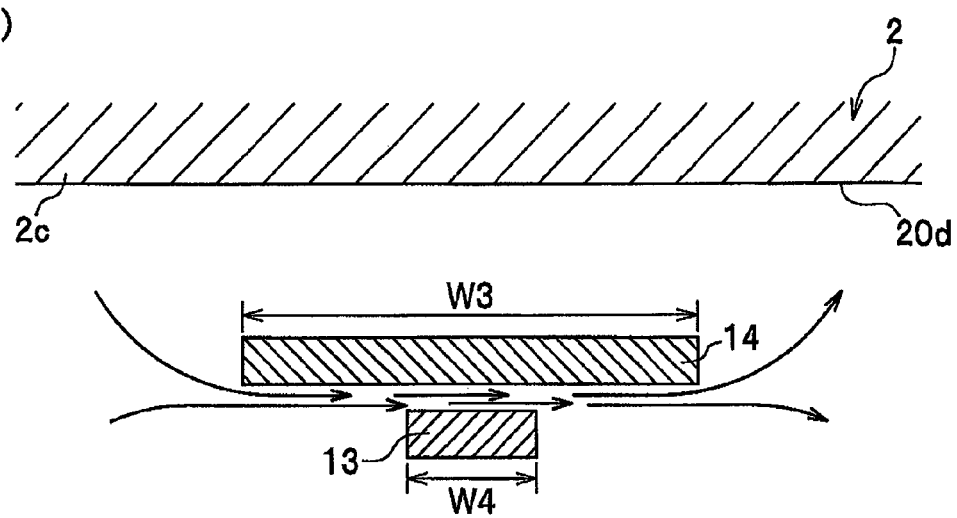

POSITION ON VACUUM VESSEL
(CONDUCTOR)

FIG. 19
(a)
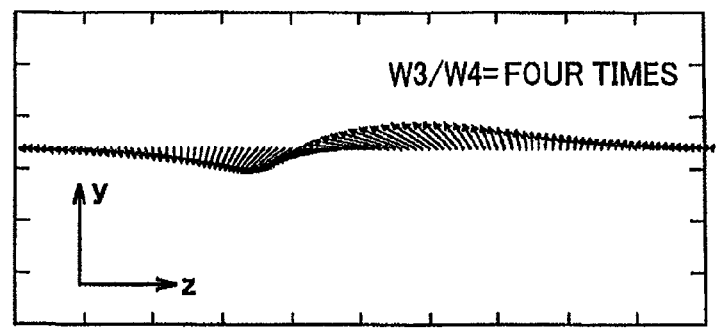
W3/W4= FOUR TIMES
(b)
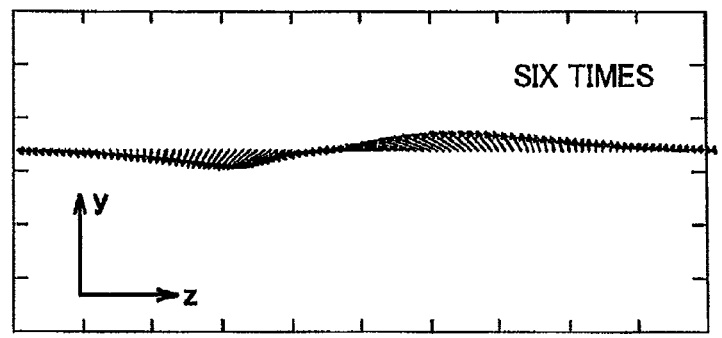
SIX TIMES
(c)
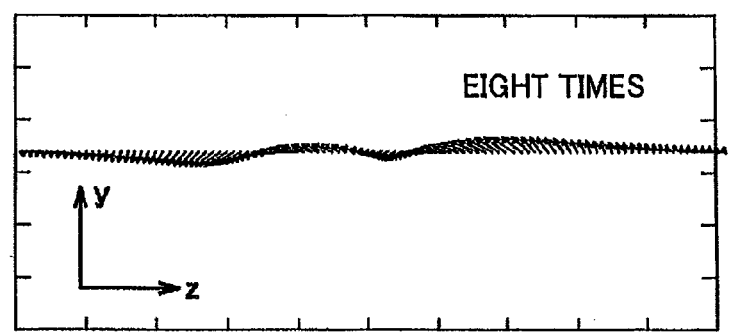
EIGHT TIMES
(d)
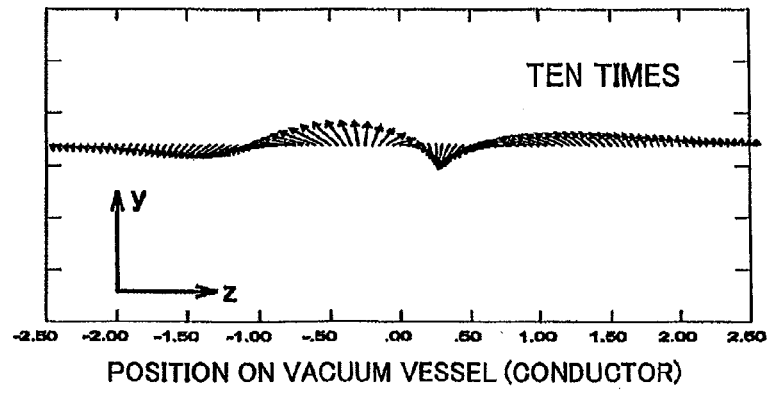
TEN TIMES
POSITION ON VACUUM VESSEL (CONDUCTOR)

FIG.20
(a)
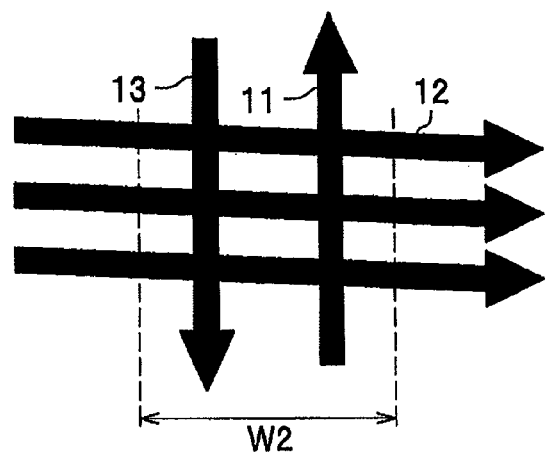
(b)
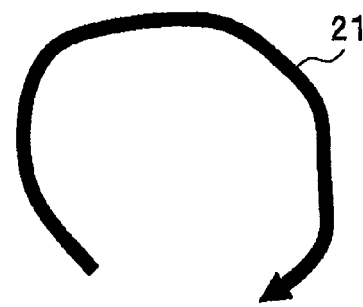
(c)
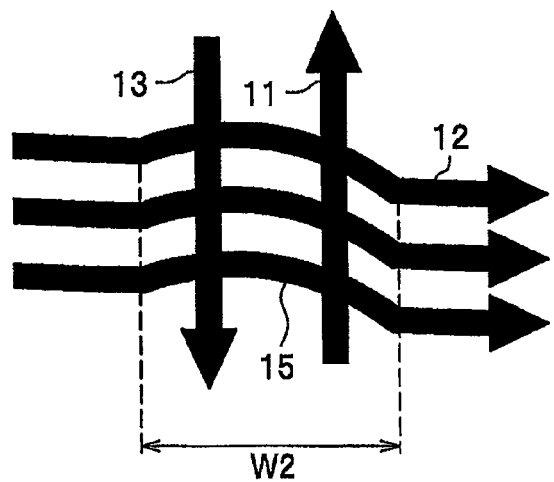

GRADIENT COIL, MAGNETIC RESONANCE IMAGING DEVICE, AND METHOD FOR DESIGNING COIL PATTERN

TECHNICAL FIELD

The present invention relates to a nuclear magnetic resonance imaging (hereinafter referred to as MRI) device, a gradient-magnetic-field coil device used for the MRI device, and a method for designing the coil pattern/patterns of a coil/coils provided in the gradient-magnetic-field coil device.

BACKGROUND ART

An MRI device is a device to obtain a cross-sectional image representing a physical and chemical properties of a subject, using a nuclear magnetic resonance phenomenon that occurs when the subject is placed in a uniform static magnetic field and is irradiated with high frequency pulses, and is particularly used for medical purposes. An MRI device mainly includes a static-magnetic-field coil device for generating a uniform static magnetic field in an image capturing region where a subject is inserted, a gradient magnetic field coil for a generating gradient magnetic field in a pulse form to provide information on positions in the image capturing region wherein the strength of the gradient magnetic field has a spatial gradient, an RF coil for irradiating the subject with high frequency pulses, a receiving coil for receiving magnetic resonance signals from the subject, and a computer system for processing the received magnetic resonance signals and displaying a cross-sectional image as described above. FIG. 1 shows the outline of an MRI device. A magnetic field generated by a static-magnetic-field coil device 2 has a uniform magnetic field strength in an image capturing region 8 at the center of the device. A gradient magnetic field coil 3 generates a gradient magnetic field in this region. The central axis 10 is in parallel to the direction of the static magnetic field and is the symmetry axis of the static magnetic field coil of the MRI device. An affected part of a patient subject 5 is placed in the image capturing region 8 by moving a bed 6 or in another way.

For improving the performance of an MRI device, a gradient magnetic field coil for generating a gradient magnetic field whose magnetic field strength has a linear gradient have been proposed (refer to Patent Documents 1 to 3).

BACKGROUND ART DOCUMENTS

Patent Documents

Patent Document 1: JP 2001-327478 A (FIG. 2)
Patent Document 2: Translation of PCT Application JP-T-2006-506155
Patent Document 3: JP 2007-175438 A
Patent Document 4: JP H08-38457 (FIG. 4)

DISCLOSURE OF THE INVENTION

Problems to be Solved by the Invention

As disclosed by Patent Documents 1 to 4, an MRI device is provided with gradient magnetic field coils to generate a magnetic field having gradients in the directions of three axes. The gradient magnetic field coil is in a tube shape, normally a cylindrical shape, however, a gradient magnetic field coil having a bore with an elliptical cross-section is also presented, as described in Patent Document 1. The shape may be different, however, such a coil is an active-shield gradient magnetic field coil in a combination of a main coil for a generating gradient magnetic field in an image capturing region and a shield coil for cancelling a magnetic field leaking from the main coil to the side of a static-magnetic-field coil device. Gradient magnetic field coils are in a tube shape, however, main coils and shield coils include coils in a saddle shape. Each of a main coil and a shield coil in a saddle shape includes plural turns disposed in multiplication in a coil pattern, and neighboring turns are connected by crossover wires. A return wire is provided for an inside turn so that a current can flow in the plural turns. Gradient magnetic field coils are laminated, as shown in FIG. 3, in order to generate magnetic fields having gradients in three directions. In general, main coils (xGMC, yGMC, and zGMC), in three directions, for generating gradient magnetic fields and shield coils (xGSC, yGSC, and zGSC) for reducing magnetic fields that leak to the static-magnetic-field coil device are laminated.

However, for a conventional gradient magnetic field coil, design is made such that a linear gradient magnetic field is formed in a case that a current flows only in plural turns. Accordingly, it is understood that an error magnetic field is generated by a current that flows in crossover wires and a return wire. This error magnetic field causes eddy currents on the static-magnetic-field coil device, and it is understood that these eddy currents may form a magnetic field on the image capturing region, wherein this magnetic field degrades a cross-sectional image. It is understood that such eddy currents are generated because design for the coil pattern of a shield coil, for reducing generation of eddy currents caused by a leakage magnetic field, is carried out without taking into account crossover wires and a return wire.

Further, conventionally, gradient magnetic field coils have been proposed in such a manner that the shape of an outer shape is elliptical, or main coils and shield coils are connected turn by turn corresponding to each other, or in other ways. As described in Patent Documents 1 and 2, in designing the coil patterns of such shield coils, current density distribution is represented by combination of known functions, and a magnetic field distribution is approximated to a target magnetic field by optimization of weights between the functions. By such a method using known functions, the coil patterns of gradient magnetic field coils can be designed in a case that the known functions are given, for cylindrical shapes, elliptical cross-sectional shapes, or the like. However, for elliptical cross-sectional shapes, it is difficult to carryout designing of coil patterns with high accuracy. Further, in general, a gradient magnetic field coil is not necessarily in a simple shape, and it is desired that magnetic shielding is attained even in a case of main coils with a non-circular cross-section, for example, as described in Patent Document 3, or in a case that an error magnetic field is generated by crossover wires and a return wire. In Patent Document 4, a method is developed and employed that handles a coil surface by a group of circulation elements so that the method is applicable to various gradient magnetic field coils. Even with circulation current elements, the shape of a current carrying surface has a larger degree of freedom, compared with the representation of current by functions described in Patent Document 1 or the like, however, it has a drawback of difficulty in representing a circling current in a tube-shaped system such as z-GC. The present invention presents a design method that is more excellent in arbitrariness.

In this situation, an object of the present invention is to provide a gradient magnetic field coil, an MRI device, and a method for designing coil patterns, which are capable of reducing generation of error magnetic fields and eddy currents, regardless of the tube-formed cross-sectional shapes of main coils and shield coils and thereby improving the image quality of a cross-sectional image.

Means for Solving the Problems

To achieve above-described object, the present invention is characterized by a gradient magnetic field coil, comprising:

a first coil (main coil) in a tube shape, the first coil generating linear magnetic field distribution in an image capturing region of a nuclear magnetic resonance imaging device; and a second coil (shield coil) in a tube shape, the second coil being arranged outside the first coil and inside a static magnetic field coil device, generating a static magnetic field with uniform magnetic field distribution in the image capturing region, and reducing a leakage magnetic field that is from the first coil to the static magnetic field coil device, wherein a cross-section, of the second coil, perpendicular to an axis of the tube shape of the second coil is circular, and a cross-section, of the first coil, perpendicular to an axis of the tube shape of the first coil is approximately circular or not circular, and wherein a plurality of turns arranged in multiplication for a coil pattern of the first coil and/or the second coil includes a turn having a region where the included turn is convex inward, or in that a number of turns is different between the first coil and the second coil of each of two gradient magnetic field coils inclined in respective directions different from an axial direction.

In addition, the present invention is characterized by a gradient magnetic field coil, comprising:

a first coil in a tube shape, the first coil generating linear magnetic field distribution in an image capturing region of a nuclear magnetic resonance imaging device; and a second coil in a tube shape, the second coil being arranged outside the first coil and inside a static magnetic field coil device, generating a static magnetic field with uniform magnetic field distribution in the image capturing region, and the second coil reducing a leakage magnetic field that is from the first coil to the static magnetic field coil device, wherein a plurality of turns disposed in multiplication for a coil pattern of the first coil and/or the second coil is arranged such that a crossover wire connects neighboring turns with each other, a return wire is connected with an inside turn, and each crossover wire portion intersecting the return wire is serpentine.

In addition the present invention is characterized by a gradient magnetic field coil, comprising:

a first coil in a tube shape, the first coil generating linear magnetic field distribution in an image capturing region of a nuclear magnetic resonance imaging device; and a second coil in a tube shape, the second coil being arranged outside the first coil and inside a static magnetic field coil device for generating a static magnetic field with uniform magnetic field distribution in the image capturing region, and the second coil reducing a leakage magnetic field that is from the first coil to the static magnetic field coil device, wherein a plurality of turns disposed in multiplication for a coil pattern of the first coil or the second coil is arranged such that a crossover wire connects neighboring turns with each other, a return wire is connected with an inside turn, and a width of each crossover wire intersecting the return wire is larger than or equal to four times and smaller than or equal to ten times a width of the return wire.

In addition, the present invention is characterized by a gradient magnetic field coil, comprising:

a first coil in a tube shape, the first coil generating linear magnetic field distribution in an image capturing region of a nuclear magnetic resonance imaging device; and a second coil in a tube shape, the second coil being arranged outside the first coil and inside a static magnetic field coil device, generating a static magnetic field with uniform magnetic field distribution in the image capturing region, and the second coil reducing a leakage magnetic field that is from the first coil to the static magnetic field coil device, wherein turns arranged in multiplication for a coil pattern of the first coil or the second coil are connected with a current supply wire and a return wire, and one section of the each turn intersecting with the current supply wire and the return wire which are arranged adjacent to each other is bypassing.

In addition the present invention is characterized by a nuclear magnetic resonance imaging device, comprising:

the gradient magnetic field coil described above; and the static magnetic field coil device described above and arranged adjacent to the gradient magnetic field coil.

In addition, the present invention is characterized by a method for designing coil pattern of at least one of a first coil in a tube shape, the first coil generating linear magnetic field distribution in an image capturing region of a nuclear magnetic resonance imaging device, and a second coil in a tube shape, the second coil reducing a leakage magnetic field that is from the first coil to a static magnetic field coil device for generating uniform magnetic field distribution in the image capturing region, the method for designing comprising:

representing an initial value of current distribution on a current carrying surface of at least one of the first coil and the second coil, by a current potential vector assigned to nodes of finite surface elements;

representing a target magnetic field at a plurality of magnetic field evaluation points which are set on at least one of the image capturing region and the static magnetic field coil device, by a magnetic field vector;

obtaining singular values, a group of eigen vectors of magnetic field distribution, and a group of eigen vectors of current potential, by a response matrix from the current potential vector to the magnetic field vector and singular value decomposition of the response matrix;

setting a difference between the target magnetic field and an initial value of the magnetic field vector as a difference target magnetic field; and representing an approximated value of a current potential vector that generates the difference target magnetic field, by a polynomial of the group of eigen vectors of the current potential, and determining coefficients of respective terms of the polynomial, based on the singular values and the group of singular vectors of the magnetic field distribution.

Further, according to the invention, an MRI device includes: a gradient magnetic field coil having a coil pattern, wherein at least one of the first coil and the second coil of the coil pattern is designed by the method for designing coil pattern; and the static magnetic field coil device arranged adjacent to the gradient magnetic field coil.

Advantageous Effect of the Invention

According to the present invention, it is possible to provide a method for designing a gradient magnetic field coil/coils, an MRI device, and a coil pattern that is capable of reducing generation of error magnetic fields and eddy currents, reducing vibration, and improving the image quality of a cross-sectional image, regardless of the cross-sectional shapes of tube shapes of a main coil and a shield coil.

BRIEF DESCRIPTION OF THE DRAWINGS

FIG. 10 shows a case where the cross-sectional shape of the y-direction gradient-magnetic-field main coil of the gradient magnetic field coil is circular, wherein FIG. 10(a) shows the coil pattern (contours of current potential distribution) of the y-direction gradient-magnetic-field main coil of the gradient magnetic field coil formed in step S8 of the method for designing coil pattern, while FIG. 10(b) shows the coil pattern (contours of current potential distribution) of the y-direction gradient-magnetic-field shield coil;

FIG. 11 shows a case where the cross-sectional shape of the y-direction gradient-magnetic-field main coil of the gradient magnetic field coil is elliptical, wherein FIG. 11(a) shows the coil pattern (contours of current potential distribution) of the y-direction gradient-magnetic-field main coil of the gradient magnetic field coil formed in step S8 of the method for designing coil pattern; FIG. 11 (b) shows the coil pattern (contours of current potential distribution) of the y-direction gradient-magnetic-field shield coil; FIG. 11(c) shows the coil pattern (contours of current potential distribution) of the x-direction gradient-magnetic-field main coil; and FIG. 11(d) shows the coil pattern (contours of current potential distribution) of the x-direction gradient-magnetic-field shield coil;

FIG. 12 shows examples of a computational system with finite surface elements created in step S1 of the method for designing coil pattern, wherein, in FIG. 12(a), the cross-sectional shape of the y-direction gradient-magnetic-field main coil, the cross-section being perpendicular to z-axis direction, is substantially a triangle, and in FIG. 12(b), the cross-sectional shape of the y-direction gradient-magnetic-field main coil, the cross-section being perpendicular to z-axis direction, is substantially a quadrangle;

FIG. 13 shows a case where the cross-sectional shape of the y-direction gradient-magnetic-field main coil of the gradient magnetic field coil is substantially quadrangular, wherein FIG. 13(a) shows the coil pattern (contours of current potential distribution) of the y-direction gradient-magnetic-field main coil of the gradient magnetic field coil formed in step S8 of the method for designing coil pattern; FIG. 13(b) shows the coil pattern (contours of current potential distribution) of the y-direction gradient-magnetic-field shield coil; and FIG. 13(c) is a cross-sectional view on a x-y axis plane, showing the position relationship between the y-direction gradient-magnetic-field main coil of the gradient magnetic field coil and the y-direction gradient-magnetic-field shield coil;

FIG. 14(a) shows an example of a computational system with finite surface elements created in step S1 of the method for designing coil pattern, wherein the end portion, with respect to z-axis direction, of the y-direction gradient-magnetic-field main coil is in a circular truncated cone shape, and FIG. 14(b) is a cross-sectional view of the MRI device, the cross-sectional view being obtained by cutting the MRI device by the y-z plane including the axis of symmetry (z-axis), showing the shapes of the y-direction gradient-magnetic-field main coil and the y-direction gradient-magnetic-field shield coil;

FIG. 15 shows a case where the end portion, with respect to z-axis direction, of the y-direction gradient-magnetic-field main coil of the gradient magnetic field coil is in a circular truncated cone shape, wherein FIG. 15(a) shows the coil pattern (contours of current potential distribution) of the y-direction gradient-magnetic-field main coil of the gradient magnetic field coil formed in step S8 of the method for designing coil pattern, while FIG. 15(b) shows the coil pattern (contours of current potential distribution) of the y-direction gradient-magnetic-field shield coil;

FIG. 16(a) is an enlarged view of the peripheries of the return wire and the crossover wires of an initial GC coil pattern prepared in steps S2 and S4 of the method for designing coil pattern; FIG. 16(b) is a conceptual diagram of adjustment currents (for the displacement amount of the coil pattern) corresponding to the approximated values of the current potential vector computed in step S10; and FIG. 16(c) is an enlarged view of the peripheries of the crossover wires that are displaced, based on the displacement of the coil pattern computed in step S8;

FIG. 17(a) is an arrangement diagram of a case where the return wire is arranged on the side of the static-magnetic-field coil device with respect to the crossover wires; and FIG. 17(b) is an arrangement diagram of a case where the return wire is arranged on the side opposite to the static-magnetic-field coil device with respect to the crossover wires;

FIG. 19 is distribution diagrams of the error magnetic field component that is formed on the vacuum vessel (conducting object) of the static-magnetic-field coil device, the error magnetic field component being generated by the return wire and the crossover wires, in a case that the return wire is arranged on the side opposite to the static-magnetic-field coil device with respect to the crossover wires, wherein FIG. 19(a) shows a case that the crossover width W3 is 4 times the width W4 of the return wire; FIG. 19 (b) shows a case that the crossover width W3 is 6 times the width W4 of the return wire; FIG. 19 (c) shows a case that the crossover width W3 is 8 times the width W4 of the return wire; and FIG. 19 (d) shows a case that the crossover width W3 is 10 times the width W4 of the return wire; and FIG. 20 (a) is an enlarged view of the peripheries of the power supply line, the return wire, and the main wires of the initial GC coil pattern prepared in steps S2 and S4 of the method for designing coil pattern; FIG. 20 (b) is a conceptual diagram of adjustment current (for the displacement amount of the coil pattern) corresponding to the approximated value of the current potential vector computed in step S10; and FIG. 20(c) is an enlarged view of the peripheries of the crossover wires that are displaced, based on the displacement amount of the coil pattern computed in step S8.

EMBODIMENTS FOR CARRYING OUT THE INVENTION

Embodiments of the present invention will be described below in detail, with reference to the drawings, as appropriate. The same symbol will be assigned to elements which are common to figures, and overlapping description will be omitted.

First Embodiment and Computation Method

Figure 1:
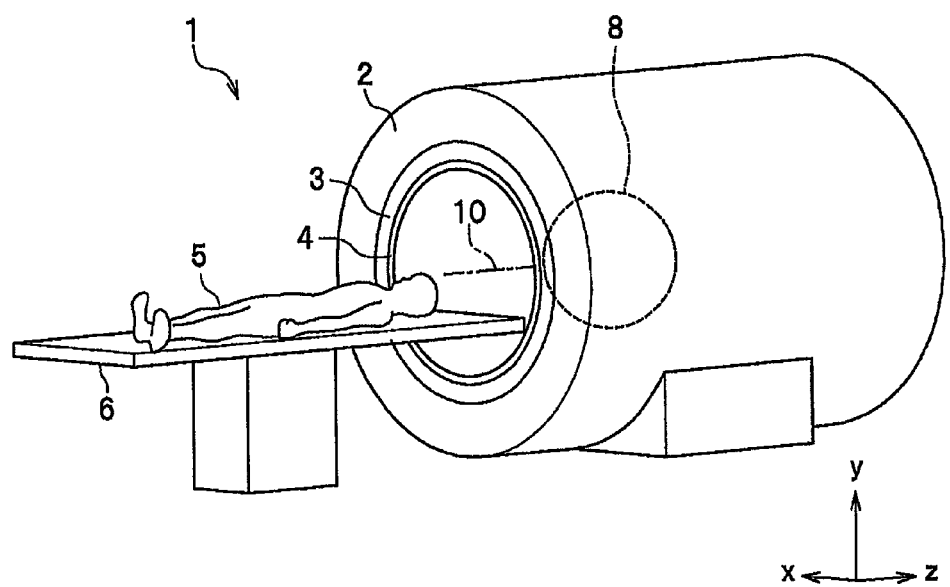
FIG. 1 is a perspective view of an MRI (nuclear magnetic resonance imaging) device according to a first embodiment of the present invention.

FIG. 1 shows an appearance view of an MRI (nuclear magnetic resonance imaging) device 1 according to a first embodiment of the present invention. The MRI device 1 includes a static-magnetic-field coil device 2 for generating a uniform static magnetic field in an image capturing region 8 into which a subject 5 is inserted in a lying state on a bed 6, a gradient magnetic field coil 3 for generating, in a pulse form, gradient magnetic fields in which magnetic field strength is spatially gradient so as to provide position information to the image capturing region 8, an RF coil 4 for irradiating the subject 5 with high frequency pulses, receiving coils (not shown) for receiving magnetic resonance signals from the subject 5, and a computer system (not shown) for processing the received magnetic resonance signals and displaying a cross-sectional image. Then, by the MRI device 1, utilizing a nuclear magnetic resonance phenomenon that occurs when the subject 5 placed in the uniform static magnetic field is irradiated with high frequency pulses, a cross-sectional image representing the physical and chemical characteristics of the subject 5 can be obtained, wherein the cross-sectional image is particularly used for a medical purpose. The static-magnetic-field coil device 2, the gradient-magnetic-field coil device, and the RF coil 4 are in respective tube shapes, wherein the central axis 10 is substantially common.

Figure 2:
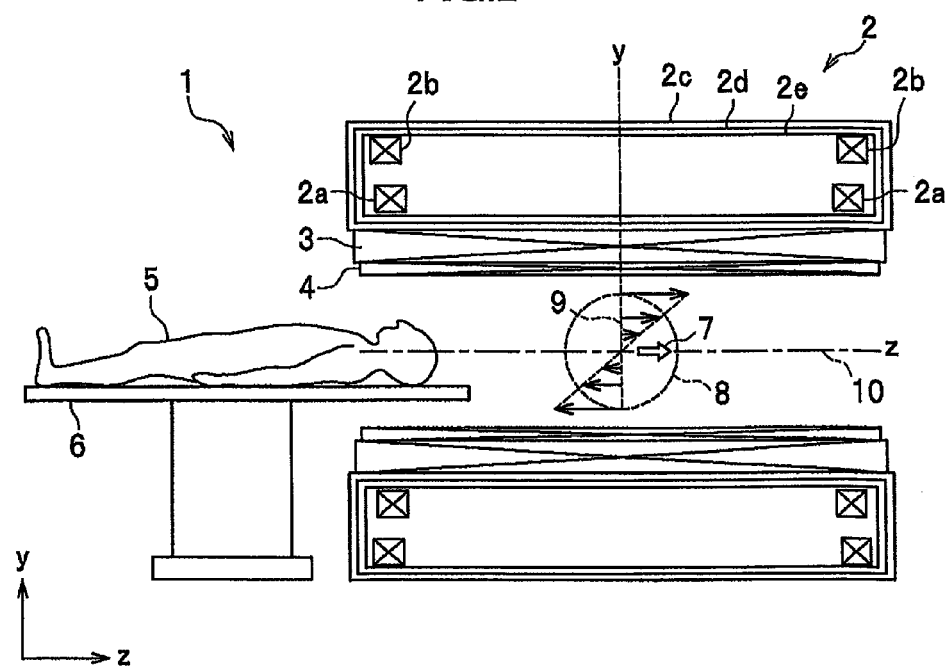
FIG. 2 is a cross-sectional view of the MRI device according to the first embodiment of the invention, the cross-sectional view being obtained by cutting the MRI device by a y-z plane including the symmetry axis (z-axis), wherein the thin arrows represent the strength of the magnetic field by a gradient magnetic field coil used for image capturing, and the thick arrow represents the direction of the static magnetic field.

FIG. 2 shows a cross-sectional view of the MRI device 1. The MRI device 1 is a horizontal magnetic field MRI device with which the static magnetic field direction 7 is along the horizontal direction. The subject 5 is carried by the movable bed 6 to the image capturing region 8. For easy understanding of later description, x axis, y axis, and z axis are set perpendicular to each other, and the origin is set close to the center of the image capturing region 8. Z axis is set such as to agree with the symmetry axis 10 of the cylindrical magnet, and also agrees with the static magnetic field (magnetic field line) direction 7. Y axis is set horizontally. X axis is set perpendicular to the sheet. For the static-magnetic-field coil device 2, used are a static-magnetic-field main coil 2a and a group of static-magnetic-field shield coils 2b for reducing leakage of the static magnetic field to the surroundings, such as to form a left and right (portions where z<0 and z>0) pair with respect to the z=0 plane. These coils 2a, 2b are in annular shapes with the symmetry axis 10 as the common central axis. Inmost cases, superconductive coils are used for these coils 2a, 2b, wherein the coils 2a, 2b are housed in a vessel with a three-layer structure. First, the coils 2a, 2b are housed in a refrigerant vessel 2e together with liquid helium (He) as refrigerant. The refrigerant vessel 2e is housed in a heat radiation shield 2d for shielding heat radiation into inside the refrigerant vessel 2e. The vacuum vessel 2c, houses the refrigerant vessel 2e and the heat radiation shield 2d, while maintaining the inside thereof vacuum. As the inside of the vacuum vessel 2c is maintained vacuum, even when the vacuum vessel 2c is set in a room of a normal room temperature, it does not occur that the heat inside the room is transferred to the refrigerant vessel 2e by conduction or convection. Further, heat radiation shield 2d reduces transfer of the heat of the room through vacuum vessel 2c to the refrigerant vessel 2e by radiation. Accordingly, the coil group can be set stably at an ultralow temperature, which is the temperature of the refrigerant, to enable a function as a superconductive electromagnet. In order that an unnecessary magnetic field is not generated, nonmagnetic materials are employed for the refrigerant vessel 2e, the heat radiation shield 2d, and the vacuum vessel 2c, and more particularly, nonmagnetic metals are employed for easy maintenance of vacuum. Accordingly, the refrigerant vessel 2e, the heat radiation shield 2d, and particularly, the vacuum vessel 2c disposed at the outermost circumference, are in a state that eddy currents tend to be generated.

The gradient magnetic field coil 3 has a tube shape. The tube gradient magnetic field coil 3 is arranged such as to surround the image capturing region 8 therein. The RF coil 4 also has a tube shape. The tube-shaped RF coil 4 is arranged such as to surround the image capturing region 8 therein. The gradient magnetic field coil 3 generates gradient magnetic fields 9 in a pulse state one after another, where the magnetic field strength of the component in the same direction as a static magnetic field 7 is inclined in the respective three directions of x direction, y direction, and z direction. The gradient magnetic field coil 3 has a function to generate the gradient magnetic fields 9, which are independent between the three directions of x direction, y direction, and z direction, superimposing the gradient magnetic fields 9 on a static magnetic field. FIG. 2 shows the gradient magnetic field 9 inclined in y direction.

Figure 3:
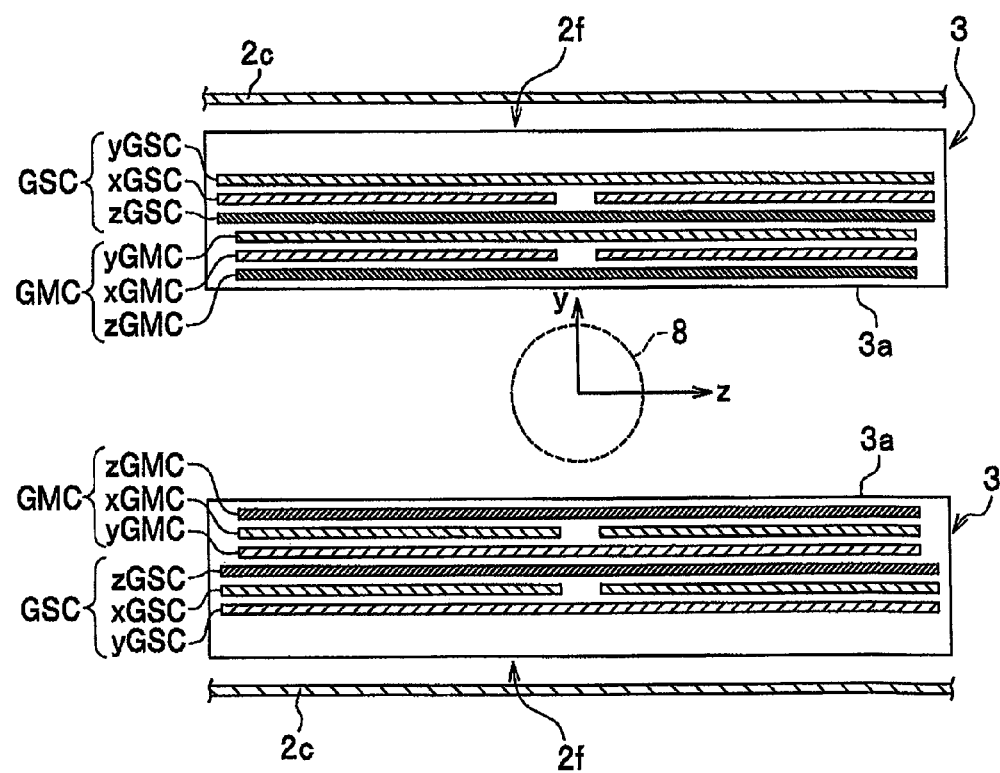
FIG. 3 is a cross-sectional view of the gradient magnetic field coil according to the first embodiment of the invention.

FIG. 3 is a cross-sectional view of the gradient magnetic field coil 3 in a tube shape. The gradient magnetic field coil 3 includes a gradient-magnetic-field main coil (a first coil)

GMC and a gradient-magnetic-field shield coil (a second coil) GSC arranged such as to surround the outer surface of the gradient-magnetic-field main coil GMC. The gradient-magnetic-field main coil GMC and the gradient-magnetic-field shield coil GSC support each other through a support member 3a (mainly of resin mold). The gradient magnetic field coil 3 is arranged close to the static-magnetic-field coil device (magnet) 2, and particularly close to a bore portion 2f of the vacuum vessel 2c.

The gradient-magnetic-field main coil GMC includes an x-direction gradient-magnetic-field main coil xGMC for creating a gradient magnetic field that linearly changes in x direction, a y-direction gradient-magnetic-field main coil yGMC for creating a gradient magnetic field that linearly changes in y direction, and a z-direction gradient-magnetic-field main coil zGMC for creating a gradient magnetic field that linearly changes in z direction. The x-direction gradient-magnetic-field main coil xGMC, the y-direction gradient-magnetic-field main coil yGMC, and the z-direction gradient-magnetic-field main coil zGMC are respectively in a tube shape, and form a triple layer structure (three layer structure). These x-direction gradient-magnetic-field main coil xGMC, the y-direction gradient-magnetic-field main coil yGMC, and the z-direction gradient-magnetic-field main coil zGMC of this three layer structure are laminated with each other with the insulation layer of the support member 3a therebetween, forming an integrated tube shape as a whole.

The gradient-magnetic-field shield coil GSC includes an x-direction gradient-magnetic-field shield coil xGSC for reducing the leakage, to surroundings, of the magnetic field formed by the x-direction gradient-magnetic-field main coil xGMC, a y-direction gradient-magnetic-field shield coil yGSC for reducing leakage, to surroundings, of the magnetic field formed by the y-direction gradient-magnetic-field main coil yGMC, and a z-direction gradient-magnetic-field shield coil zGSC for reducing leakage, to surroundings, of the magnetic field formed by the z-direction gradient-magnetic-field main coil zGMC. The x-direction gradient-magnetic-field shield coil xGSC, the y-direction gradient-magnetic-field shield coil yGSC, and the z-direction gradient-magnetic-field shield coil zGSC are respectively in a tube shape, and form a triple layer structure (three layer structure). These x-direction gradient-magnetic-field shield coil xGSC, y-direction gradient-magnetic-field shield coil yGSC, and z-direction gradient-magnetic-field shield coil zGSC of this three layer structure are laminated with each other with the insulation layer of the support member 3a therebetween, forming an integrated tube shape as a whole.

The three layered gradient-magnetic-field main coils xGMC, yGMC, and zGMC, and the three layered gradient-magnetic-field shield coils xGSC, yGSC, and zGSC are not necessarily laminated in this order, depending on requirement on the inductance and resistance of the coils. Regardless of the order, as shown in FIG. 3, three kinds of gradient-magnetic-field main coils corresponding to three dimensions, namely, xGMC, yGMC, and zGMC, and the respective shield coils xGSC, yGSC, and zGSC are laminated, forming a tube shape as a whole. The gradient magnetic field coil 3 is arranged close to the static-magnetic-field coil device 2, and particularly close to the bore portion 2f of the vacuum vessel 2c.

Figure 4:
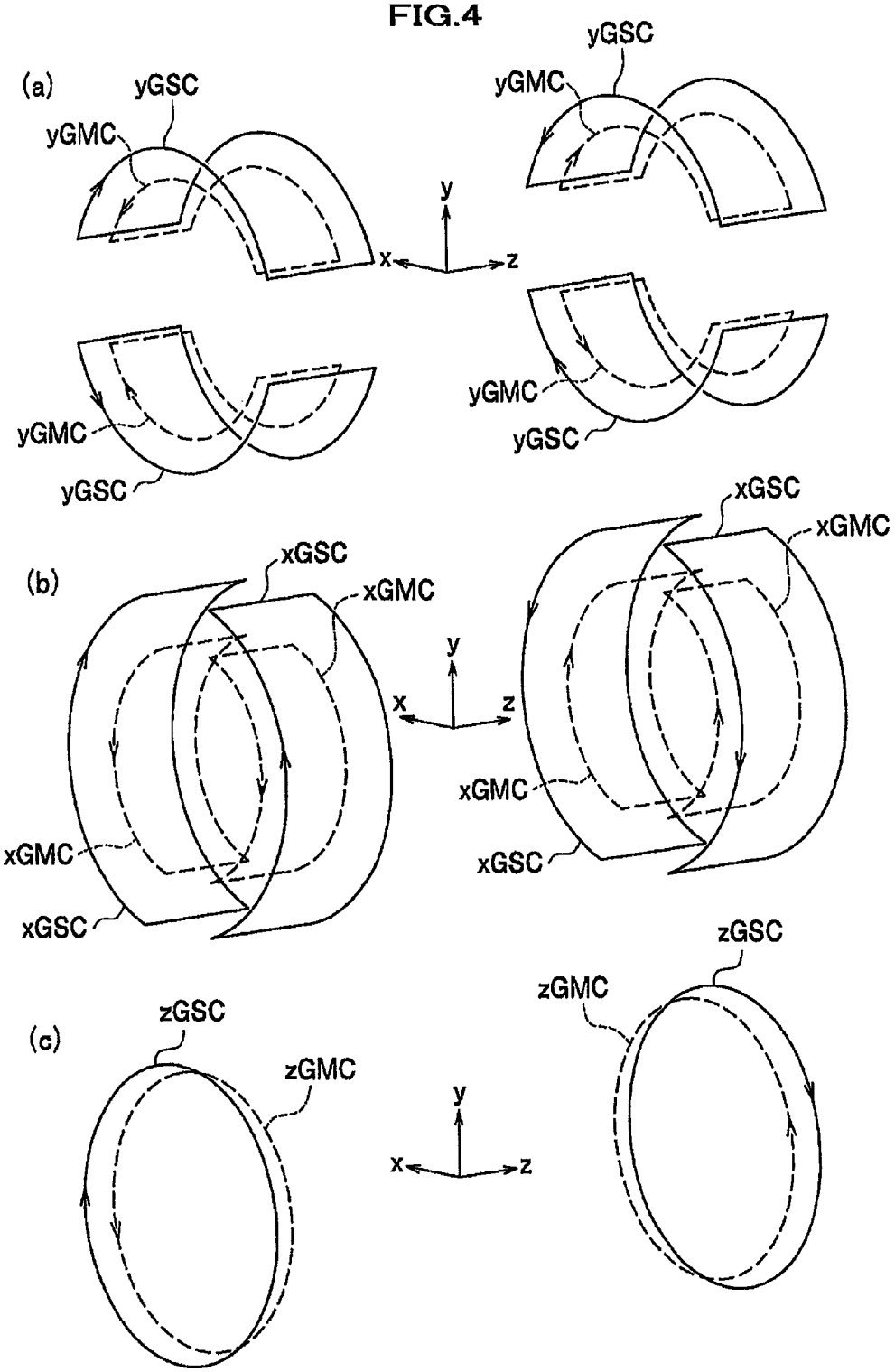
FIG. 4(a) shows conceptual diagrams of the y-direction gradient-magnetic-field main coil (yGMC) and the y-direction gradient-magnetic-field shield coil (yGSC) of the gradient magnetic field coil according to the first embodiment of the invention.
FIG. 4(b) shows conceptual diagrams of the x-direction gradient-magnetic-field main coil (xGMC) and the x-direction gradient magnetic shield coil (xGSC) of the gradient magnetic field coil according to the first embodiment of the invention.
FIG. 4(c) shows conceptual diagrams of the z-direction gradient-magnetic-field main coil (zGMC) and the z-direction gradient magnetic shield coil (zGSC) of the gradient magnetic field coil according to the first embodiment of the invention.

FIG. 4(a) is a conceptual diagram of the y-direction gradient-magnetic-field main coil yGMC and the y-direction gradient-magnetic-field shield coil yGSC. The y-direction gradient-magnetic-field shield coil (second coil) yGSC is arranged such as to cover the outer side of the y-direction gradient-magnetic-field main coil (first coil) yGMC. Both the y-direction gradient-magnetic-field main coil yGMC and the y-direction gradient-magnetic-field shield coil yGSC can be vertically divided into two coils and also can be divided into two coils along z-direction, thus covering z-axis from the upper side and the lower side, and to be in two sets of upper and lower two coils for each, and totally in eight coils. The four y-direction gradient-magnetic-field main coils yGMC are spiral-saddle-form coils in a half pipe shape, however, the spiral shape is not shown, and only the rough direction of current is shown with one turn. An arrow represents the direction of a current flowing in a coil, and likewise also in later description. Actually, a large number of winding wires (turns) are arranged in multiplication. The four y-direction gradient-magnetic-field shield coil yGSC are likewise arranged. According to the present invention, it is not necessarily required that the structure can be divided by z=0 plane, however, the structure is arranged to be symmetrical with respect to z=0 plane, and also symmetrical with respect to the planes respectively including z-y axis and z-x axis.

FIG. 4(b) is a conceptual diagram of the x-direction gradient-magnetic-field main coil xGMC and the x-direction gradient-magnetic-field shield coil xGSC. The x-direction gradient-magnetic-field shield coil (second coil) xGSC is arranged such as to cover the outer side of the x-direction gradient-magnetic-field main coil (first coil) xGMC. Both the x-direction gradient-magnetic-field main coil xGMC and the x-direction gradient-magnetic-field shield coil xGSC can be divided into two coils along z-direction and also can be divided into two coils with along z-direction, thus covering z-axis from the positive side and the negative side with respect to x-direction, and to be in two sets of left and right two coils, and totally in eight coils. The four x-gradient-magnetic-field main coils GMC are spiral-saddle-form coils in a partial pipe shape, however, the spiral shape is not shown, and only the rough direction of current is shown with one turn. Actually, a large number of winding wires (turns) are arranged in multiplication. The four x-gradient-magnetic-field shield coils GSC are likewise arranged. According to the present invention, it is not necessarily required that the structure can be divided by z=0 plane, however, the structure is arranged to be symmetrical with respect to z=0 plane, and also symmetrical with respect to the planes respectively including z-y axis and z-x axis.

FIG. 4(c) is a conceptual diagram of the z-direction gradient-magnetic-field main coil (first coil) zGMC and the z-direction gradient-magnetic-field shield coil (second coil) zGSC. The z-direction gradient-magnetic-field main coil zGMC is in a closed loop shape (tube shape) having z-axis therein, and is arranged in totally two coils, namely, one coil on each of the left and right sides (portions z>0 and z<0). The two z-direction gradient-magnetic-field main coils zGMC are in a pipe shape and spiral coils, however, multi-winding is not shown, and only the rough direction of current is shown only by a single turn. The two z-direction gradient-magnetic-field main coils zGMC can be divided into each one by x-y axis (z=0) plane, and have a structure that is symmetrical with respect to the x-y plane. The z-direction gradient-magnetic-field shield coil zGSC is in a closed loop shape (tube shape) having z-axis therein, and is arranged in totally two coils, namely, one coil on each of the left and right sides (portions z>0 and z<0). The two z-direction gradient-magnetic-field shield coils zGSC are in a pipe shape and are spiral coils, however, multi-winding is not shown, and only the rough direction of current is shown only by a single turn. The two z-direction gradient-magnetic-field shield coils zGMC can be divided into each one by x-y axis (z=0) plane, and have a structure that is symmetrical with respect to the x-y plane. The two z-direction gradient-magnetic-field shield coils zGSC are arranged such as to surround the corresponding z-direction gradient-magnetic-field main coils zGMC. In the following description, the present invention will be described with an example of a y-direction gradient-magnetic-field main coil yGMC and a y-direction gradient-magnetic-field shield coil yGSC, the invention can also be applied likewise to an x-direction gradient-magnetic-field main coil xGMC and an x-direction gradient-magnetic-field shield coil xGSC, and a z-direction gradient-magnetic-field main coil zGMC and a z-direction gradient-magnetic-field shield coil zGSC.

Figure 5:
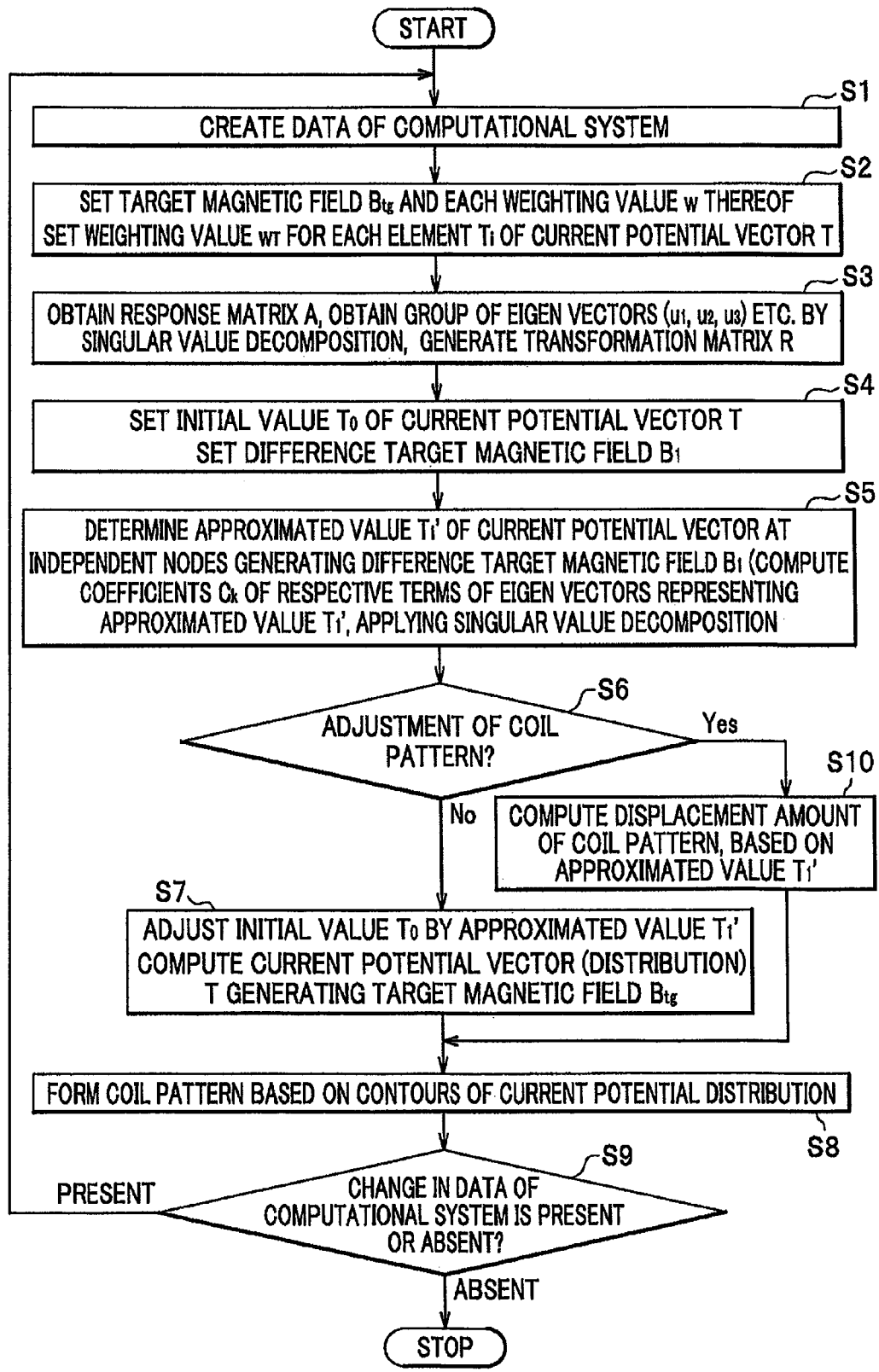
FIG. 5 is a flowchart of a method for designing coil pattern on a single current carrying surface of the y-direction gradient-magnetic-field shield coil or the like of the gradient magnetic field coil according to the first embodiment of the invention.

FIG. 5 is a flowchart of a method for designing coil pattern on a single current carrying surface of the y-direction gradient-magnetic-field shield coil or the like of a gradient magnetic field coil. Incidentally, for this method for designing, it is possible to use a method reported in document 'M. ABE, T. NAKAYAMA, S. OKAMURA, K. MATSUOKA, "A new technique to optimize coil winding path for the arbitrarily distributed magnetic field and application to a helical confinement system", Phys. Plasmas. Vol. 10 No. 4 (2003) 1022.'. In the above-described document, it is described that current potentials are defined at nodes of finite elements, and current potential distribution is optimized such that current distribution represented by the current potential values generates a target magnetic field.

Figure 6:
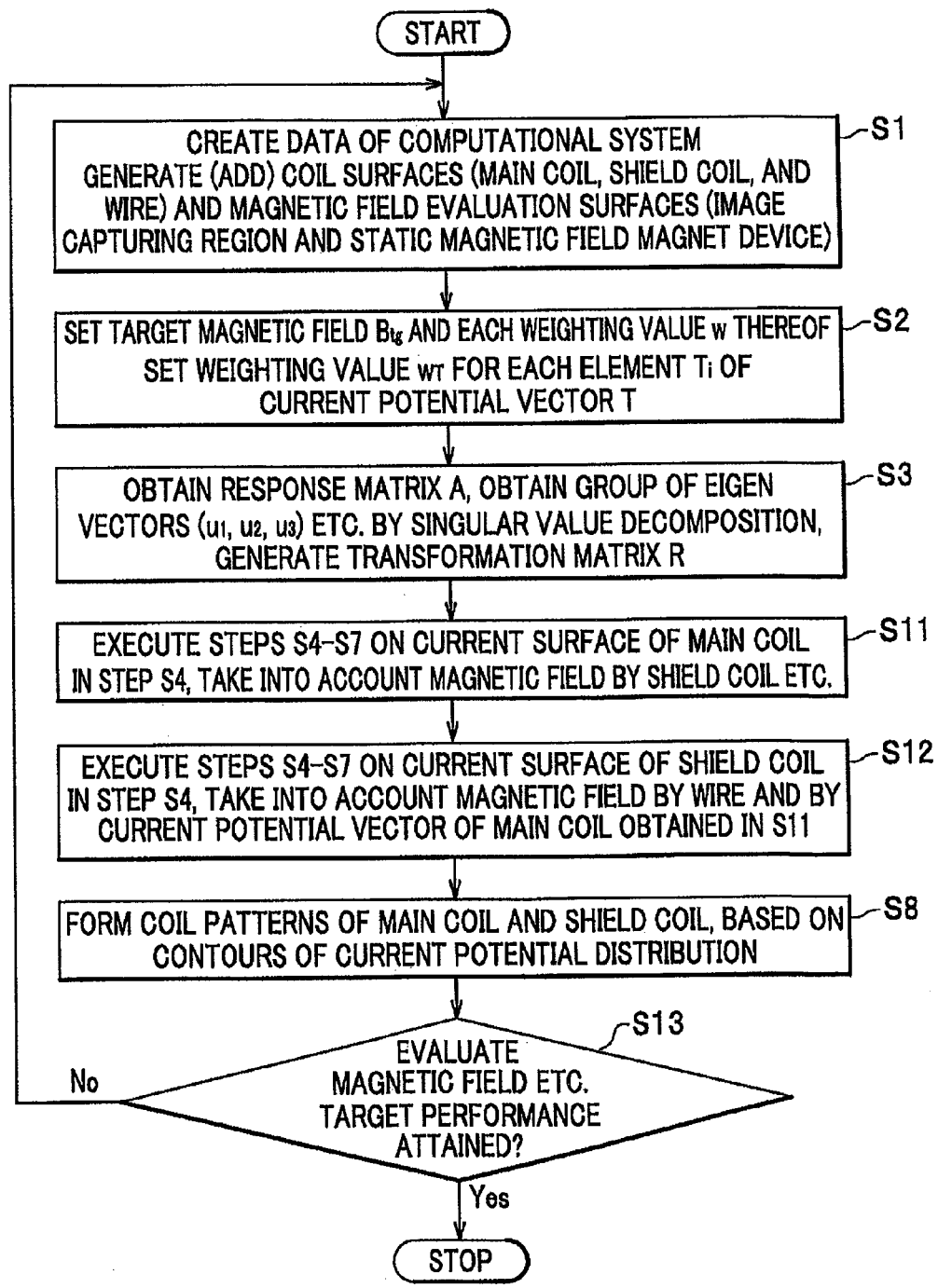
FIG. 6 is a flowchart of a method for designing coil patterns on plural current carrying surfaces of the y-direction gradient-magnetic-field main coil, the y-direction gradient-magnetic-field shield coil and the like of the gradient magnetic field coil according to the first embodiment of the invention.

FIG. 6 is a flowchart of a method for designing coil patterns on plural current carrying surfaces of the y-direction gradient-magnetic-field main coil, the y-direction gradient-magnetic-field shield coil and the like of a gradient magnetic field coil. In the flowchart in FIG. 6, described is a method for designing, for example, both coil patterns, namely, the y-direction gradient-magnetic-field main coil and the y-direction gradient-magnetic-field shield coil of a gradient magnetic field coil. The flowchart in FIG. 5 is used for processing by the flowchart in FIG. 6. For the process by the flowchart in FIG. 5, described is a method for designing coil pattern on a single current carrying surface of a gradient magnetic field coil, for example, the surface of the y-direction gradient-magnetic-field shield coil or the like. First, the process by the flowchart in FIG. 5 will be described below.

In step S1, using a general purpose computer or the like, data of a computational system is created. Concretely, first, a coil surface and a magnetic field evaluation surface (MFES) are created (added). A coil surface refers to a so-called a current carrying surface (CCS) where a coil for which a coil pattern is designed is arranged. For example, provided will be either, as shown in FIG. 7, a current carrying surface 20a where a y-direction gradient-magnetic-field main coil yGMC is arranged or a current carrying surface 20b where a y-direction gradient-magnetic-field shield coil yGSC is arranged.

Figure 7:
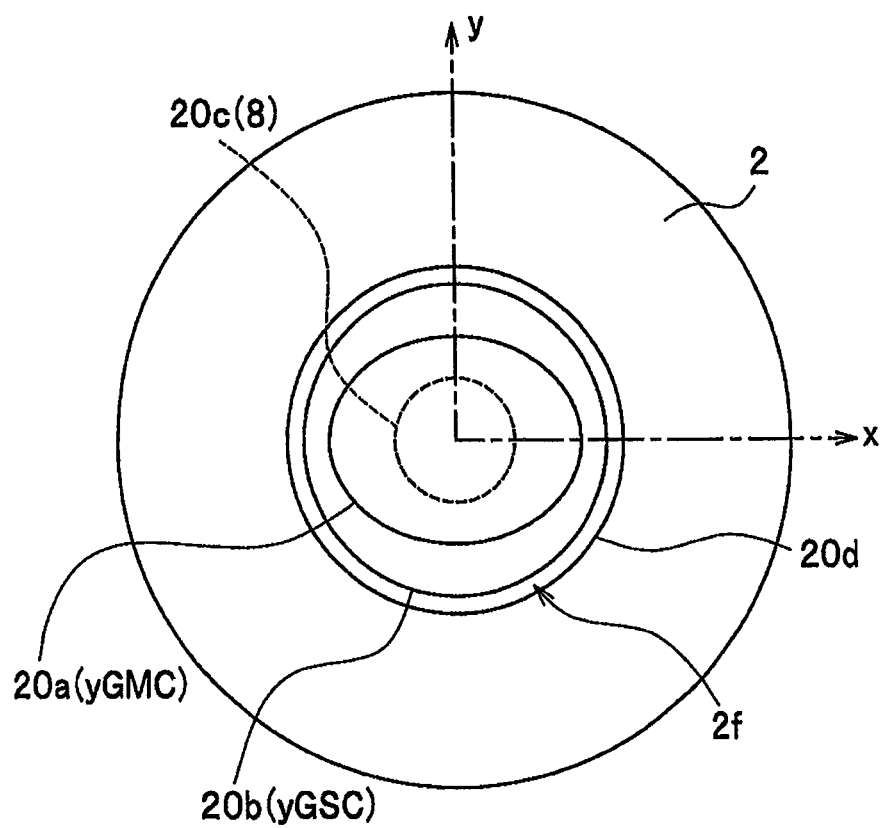
FIG. 7 is a cross-sectional view on a x-y axis plane of the MRI device, showing the position relationship between the y-direction gradient-magnetic-field main coil, the y-direction gradient-magnetic-field shield coil of the gradient magnetic field coil, and the static-magnetic-field coil device (static magnetic field magnet)

As the shape of the y-direction gradient-magnetic-field main coil yGMC is arbitrary, also in FIG. 7, the y-direction gradient-magnetic-field main coil yGMC is shown not in a circular shape but in an elliptical shape. Gradient magnetic field coils include three kinds, corresponding to three axes, however, only a pair in y-direction is shown here by curves, and others are omitted. Although the y-direction gradient-magnetic-field shield coil yGSC also is permitted to have an arbitrary cross-sectional shape, desired is a shape along the cylindrical surface of the vacuum vessel 2c, the surface being on the smaller radius side and facing the bore 2f of the static-magnetic-field coil device (magnet) 2. Accordingly, the y-direction gradient-magnetic-field shield coil yGSC is shown in a cylindrical shape.

The gradient magnetic fields 9 can be evaluated, for example, by setting, as a magnetic field evaluation surface, a magnetic field evaluation surface (image capturing region magnetic field evaluation surface) 20c on the outermost circumferential surface of the sphere shape of the image capturing region 8 where gradient magnetic field is formed. Further, shield effect can be evaluated by, for example, setting a magnetic field evaluation surface (shield effect magnetic field evaluation surface) 20d on the inner circumferential surface, of the static-magnetic-field coil device 2, where eddy currents as described above tend to be caused by a leakage magnetic field due to an error magnetic field or the like.

Figure 8:
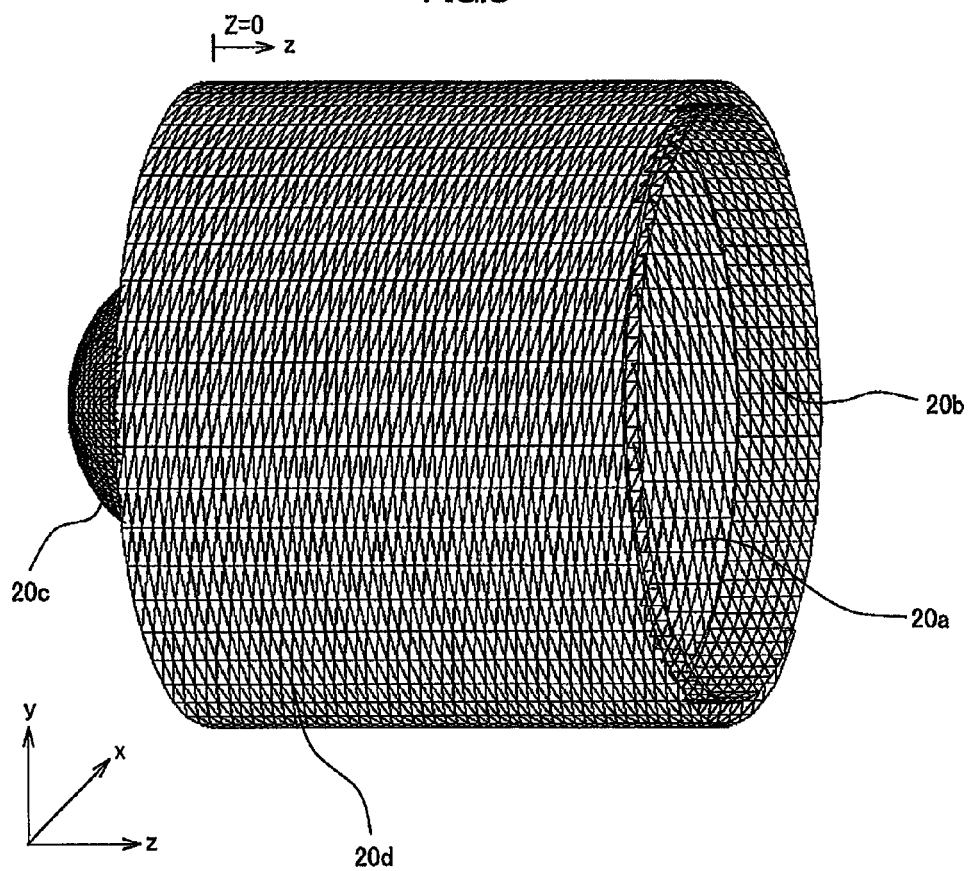
FIG. 8 shows an example of a computational system with finite surface elements created in step S1 of the method for designing coil pattern.

Next, as shown in FIG. 8, finite surface elements in triangle shapes are generated with a mesh on either the current carrying surface 20a or the current carrying surface 20b. Further, magnetic field evaluation points are generated on the magnetic field evaluation surface 20c and the magnetic field evaluation surface 20d. It is not necessary to form magnetic field evaluation points on the magnetic field evaluation surfaces 20c and 20d, but in FIG. 8, magnetic field evaluation points are set at the apexes of triangles generated on the mesh.

For the current carrying surfaces 20a and 20b, only the portion z>0 is shown while the portion z<0 is omitted, however, the portion z>0 and the portion z<0 are in a plane symmetry relationship with respect to the plane z=0. On the other hand, for the magnetic field evaluation surface 20c for the image capturing region, a spherical shape is shown also including the portion z<0. For the magnetic field evaluation surface 20d for evaluation of the effect of the y-direction gradient-magnetic-field shield coil yGSC, only the portion z>0 is shown while the portion z<0 is not shown, however, the portion z>0 and the portion z<0 are in a plane symmetry relationship with respect to the plane z=0. The x-y cross-sectional shape of the current carrying surface 20a is not limited to a circular shape, and is arbitrary, and may be an ellipse, a triangle, a quadrangle, or the like. The axes (z-axis) of the tube-shaped current carrying surfaces 20a and 20b agree with direction 7 of the strong static magnetic field at the center of the MRI device 1. The coil pattern of the y-direction gradient-magnetic-field shield coil yGSC is computed on the outer tube-shaped current carrying surface 20b. This coil pattern may be computed, taking into account magnetic fields generated by crossover wires between neighboring turns, a current supply wire, and a return wire, which will be described in later discussion.

In step S2, using a general purpose computer or the like, a target magnetic field $B_{tg}$ and weighting values w for the respective magnetic field evaluation points are set by input of the magnetic field evaluation surfaces 20c and 20d. A weighting value w corresponds to an error in measured data in a least squares method that handles experimental data. As described later, in case that there are respectively two surfaces as the current carrying surface and the magnetic field evaluation surface such as the current carrying surfaces 20a and 20b and the magnetic field evaluation surface 20c and 20d, it is desired that weighting values w (which are inversely proportional to permissible error) are set different between the magnetic field evaluation surface (the outer circumferential surface of the image capturing region 8) 20c and the magnetic field evaluation surface (the inner circumferential surface of the static-magnetic-field coil device 2) 20d.

Further, in step S2, weighting values $W_T$ are set for the respective elements $T_i$ of the current potential vector T at the nodes of the finite surface elements of either the current carrying surface 20a or the current carrying surface 20b. Concretely, weighting values $W_T$ are set for the respective finite surface elements of either the current carrying surface 20a or the current carrying surface 20b.

Figure 9:
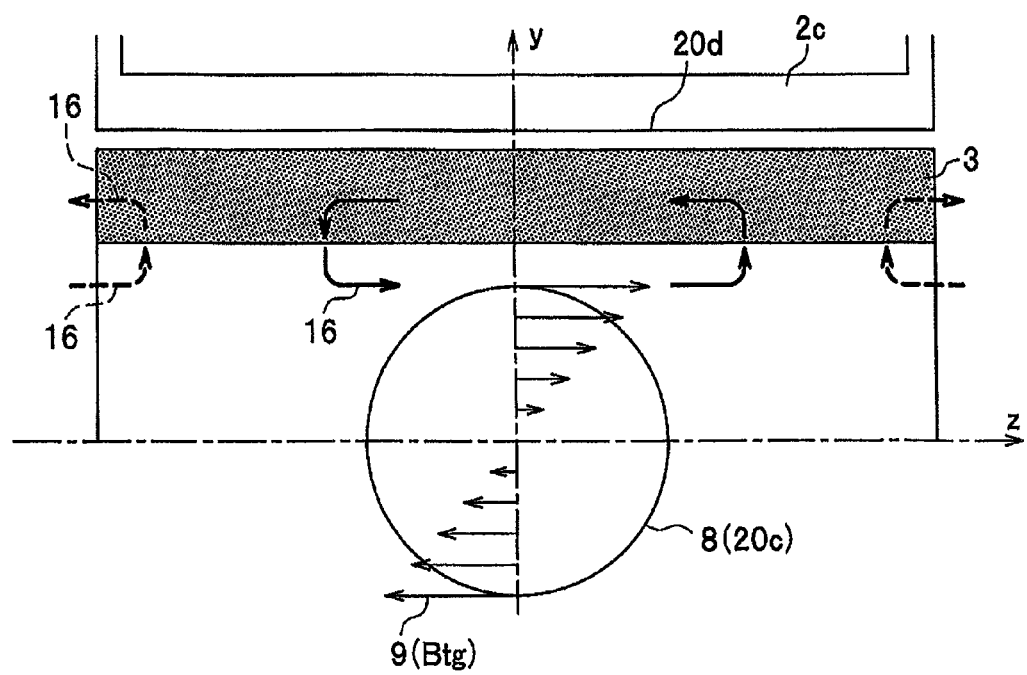
FIG. 9 is a conceptual diagram showing a state of a gradient magnetic field generated by a horizontal magnetic field MRI device, wherein a solid arrow schematically represents the direction of a magnetic field line and the strength of a magnetic field passing the image capturing region while a dashed arrow schematically represents the direction of a magnetic field line and the strength of a magnetic field forming a leakage magnetic field.

With reference to FIG. 9, the concept of target magnetic field $B_{tg}$ to be attained on the magnetic field evaluation surfaces 20c and 20d will be described. Arrows 16 represent the directions of magnetic field lines and the strengths of the magnetic field. The target magnetic field $B_{tg}$ on the magnetic field evaluation surface 20c is the gradient magnetic field 9 itself. As shown in FIG. 9, the strength of the z-direction magnetic field linearly changes along y-axis direction in the image capturing region 8 (in the case of the y-direction gradient-magnetic-field main coil yGMC). If y-axis is replaced by x-axis, it is the case of the x-direction gradient-magnetic-field main coil xGMC, and a similar target magnetic field $B_{tg}$ can be set. For the target magnetic field $B_{tg}$ on the magnetic field evaluation surface 20d, magnetic field lines are bent inside the gradient magnetic field coil 3 by the y-direction gradient-magnetic-field shield coil yGSC so as not to enter the side where the static-magnetic-field coil device 2 is present, and the target magnetic field $B_{tg}$ thereby becomes a magnetic field (distribution) in which no magnetic field line passes the magnetic field evaluation surface 20d.

In case that a magnetic field, which is generated by current flowing in the crossover wires and the return wire inside the coil, flowing in the current supply wire outside the coil, and the like, is known, the magnetic field is subtracted in advance from the target magnetic field $B_{tg}$. The target magnetic field $B_{tg}$ with the subtraction is newly set as the target magnetic field $B_{tg}$.

Further, in case that the magnetic field generated by the y-direction gradient-magnetic-field main coil yGMC is known and the coil pattern for the y-direction gradient-magnetic-field shield coil yGSC is designed, the magnetic field generated by the y-direction gradient-magnetic-field main coil yGMC is subtracted in advance from the target magnetic field $B_{tg}$. The target magnetic field $B_{tg}$ with the subtraction is newly set as the target magnetic field $B_{tg}$.

In step S3, using a general purpose computer or the like, from a current potential vector T having as elements the current potential values at the nodes on either the current carrying surface 20a or the current carrying surface 20b, obtained is a response matrix A to a magnetic field vector B having, as elements, the magnetic fields at the magnetic field evaluation points on the magnetic field evaluation surfaces 20c and 20d. By singular value decomposition of the response matrix A, obtained are singular values $\lambda_1$, $\lambda_2$, $\lambda_3$, an eigen vector group ($u_1$, $u_2$, $u_3$) of magnetic field distribution, and an eigen vector group ($v_1$, $v_2$, $v_3$) of current potential.

Concretely, first, Equation (1) on the above-described computational system data is built.

$$B = AT \quad (1)$$

Equation (1) represents a response, from the current potential vector T having as elements the current potential values at the nodes of the finite surface elements on the current carrying surface 20a and the current carrying surface 20b, to the magnetic field vector B having as elements the magnetic fields at the magnetic field evaluation points on the magnetic field evaluation surface 20c and the magnetic field evaluation surface 20d. The response matrix A is a matrix with the number of the magnetic field evaluation points as the number of rows, and the number of nodes as the number of columns. Using equation $(\nabla T) \times n = j$ (herein, n represents a unit vector normal to a current carrying surface), the current potential vector T can be converted into a current density vector j from the gradient ($\nabla T$) thereof, and current distribution can thereby be computed. From the computed current distribution, the magnetic field vector B can be computed, using the Biot-Savart equation. In this situation, a current density vector j, current distribution, and a magnetic field vector B are sequentially computed on a certain current potential vector T, and the response matrix A is thereby determined such as to satisfy the response relationship represented by Equation (1) between a certain current potential vector T and the computed magnetic field vector B.

Constraint conditions at the nodes on the current carrying surface 20a and the current carrying surface 20b are applied to the current potential vector having as elements the current potential values at all nodes on the current carrying surface 20a and the current carrying surface 20b. A current potential vector T' at independent nodes having independent variations from other nodes is generated, wherein the independent nodes out of all the nodes are set to be nodes of objects of consideration. The relation of the current potential vector T' at the independent nodes to the current potential vector at all the nodes is represented by Equation (2). The current potential at nodes as objects of consideration which are not the independent nodes can be computed, based on the current potentials at the independent nodes and a constant. Herein, R represents a transformation matrix with the number of all nodes as the number of rows and with the number of independent nodes as the number of columns.

$$T = RT' \quad (2)$$

The transformation matrix R is nothing but a unit matrix if all the nodes are independent, however, for a real system, on condition that no current leaks from the end portion of a coil, conditions are added including that the current potentials at the nodes positioned at the end portion are required to be all the same. Accordingly, the number of rows that is equal to the number of all the nodes is not equal to the number of columns that is equal to the number of independent nodes. Taking into account Equation (2), if above-described Equation (1) is rewritten, then Equation (3) is obtained.

$$B = AT = A(RT') = (AR)T' = A'T' \quad (3)$$

Equation (3) represents a response from the current potential vector T' having as elements the current potential values at the independent nodes on the current carrying surface 20a and the current carrying surface 20b, to the magnetic field vector B having as elements the magnetic fields at the magnetic field evaluation points on the magnetic field evaluation surfaces 20c and 20d. A response matrix A' is a matrix with the number of magnetic field evaluation points as the number of rows and with the number of independent nodes as the number of columns. According to Equation (3), the response matrix A' is obtained from the response matrix A, using Equation (4).

$$A' = AR \quad (4)$$

Then, the response matrix A' is subjected to singular value decomposition to obtain an eigen distribution function (group of eigen vectors) of magnetic field distribution (magnetic field vector B) as represented by Equation (5), and an eigen distribution function (group of eigen vectors) of current potential distribution (current potential vector T) as represented by Equation (6).

$$u_1, u_2, u_3 \quad (5)$$

$$v_1, v_2, v_3 \quad (6)$$

There is a relationship represented by Equation (7) between $u_j$ and $v_j$. Herein, $\lambda_j$ is a singular value. The suffix j of a singular value $\lambda_j$ is a number representing the descending order of a singular value, and the same number is assigned to corresponding eigen vectors $u_j$ and $v_j$ in relationship represented by Equation (7). That is, a singular value $\lambda_j$, an eigen vector $u_j$, and an eigen vector $v_j$ are in a set.

$$\lambda_j \cdot u_j = A' \cdot v_j \quad (7)$$

In step S4, using a general purpose computer or the like, the initial value $T_0$ (or $T_0'$) of the current potential vector T (or T') is set. This will become the initial condition of computation in the next step S5.

The initial value $T_0$ of the current potential vector T may be set to the zero vector. Further, a current potential vector T, based on which the coil pattern of a gradient magnetic field coil has been once completed by a design method according to the present invention, may be set as the initial value $T_0$. The latter can be applied to a method used for adjusting a coil pattern in a case of adding a slight adjustment partially, for example, in a case of adding crossover wires and a return wire in a coil and/or adding a current supply wire between coils.

Representing the initial value of the magnetic field vector B by $B_0$, Equation (8) is satisfied according to Equation (3).

$$B_0 = AT_0 = A'T_0' \tag{8}$$

Further, in step S4, as represented by Equation (9), the difference ($B_1$) from the target magnetic field (magnetic field intended to be generated) $B_{tg}$ is set as a difference target magnetic field (for designing a coil) $B_1$.

$$B_1 = B_{tg} - B_0 \tag{9}$$

In step S5, using a general purpose computer or the like, the approximated value $T_1'$ of the current potential vector at the independent nodes that generate a difference target magnetic field $B_1$ is represented by a polynomial of the eigen vector group ($v_1$, $v_2$, $v_3$) of current potential as represented by Equation (10), and the coefficients $C_k$ of the respective terms of the polynomial are determined, based on the above-described singular values $\lambda_k$ and the eigen vector group ($u_1$, $u_2$, $u_3$) of the above-described magnetic field distribution. The approximated value $T_1'$ of the current potential vector is set as adjustment (vector) to the initial value $T_0$.

$$T_1' = C_1 v_1 + C_2 v_2 + C_3 v_3 \tag{10}$$

Concretely, the coefficients $C_k$ are determined by the following method. Basically, a coefficient $C_k$ is a magnetic field $B_1$ generated by the approximated value $T_1'$ of the current potential vector, and is determined such that the difference between the magnetic field ($=AT_1=A'T_1'$) and the difference magnetic field distribution $B_1$ becomes small ($B_1=AT_1=A'T_1'$). In this point, this is the case same as the above-described least squares method, however, herein, a coefficient $C_k$ is computed, as represented by Equation (11), by dividing the inner product between the eigen (magnetic field) distribution $u_k$ and the difference magnetic field distribution $B_1$ by the singular value $\lambda_k$.

$$C_k = (B_1 \cdot u_k)/\lambda_k \tag{11}$$

However, as necessary, adjusting, for example, the number of coefficients $C_k$ to meet a requirement on the magnetic field accuracy is of no problem (in Equation (10), the number of coefficients $C_k$ is three.) In above Equation (10), addition up to the third eigen (current) distribution, namely v1, v2, v3, is represented as an example, increasing this number would be equivalent to a solution by the least squares method.

In step S6, using a general purpose computer or the like, determined is presence or absence of a coil pattern based on which the initial value $T_0$ of the current potential vector T has been set, and it is thereby determined whether or not it is a case of adjustment of an existing coil pattern. If it is a case of adjustment of an existing coil pattern (step S6, Yes), then the process proceeds to step S10, and if not a case of adjustment of an existing coil pattern (step S6, No), then the process proceeds to step S7. If it is determined not to be an adjustment of an existing coil pattern in step S6, this is a case that the initial value $T_0$ of the current potential vector T is normally the zero vector. If it is determined to be an adjustment of an existing coil pattern in step S6, this is a case that the current potential vector T based on the coil pattern of a gradient magnetic field coil having been once completed by a design method according to the present invention has been set as the initial value $T_0$. Accordingly, it is easy to determine Yes or No in step S6. Incidentally, as adjustment of an existing coil pattern, it is applicable to adjustment of a coil pattern, which has been once completed, in a case of adding crossover wires and a return wire inside a coil, or adding a current supply wire between coils.

In step S7, using a general purpose computer or the like, the initial value $T_0$ is adjusted by the approximated value $T_1'$. Concretely, a current potential vector (distribution) T for generating a target magnetic field (magnetic field intended to be generated) $B_{tg}$ is obtained by Equation (12). The second term $RT_1'$ of Equation (12) represents a current potential vector at all nodes that generate a difference target magnetic field $B_1$ (refer to Equation (2)).

$$T = T_0 + RT_1' \tag{12}$$

In step S8, using a general purpose computer or the like, based on plural contours for respective current potential values wherein this current potential vector T is taken as the current potential distribution, the coil pattern of the y-direction gradient-magnetic-field main coil yGMC, the y-direction gradient-magnetic-field shield coil yGSC, or the like is formed. The contours are plural closed curves and are arranged in a large number such as not to cross with each other. Thus, plural turns forming a coil pattern become plural closed curves along contours, and can form the coil pattern with plural turns that are arranged in multiplication.

In step S9, using a general purpose computer or the like, presence or absence of an instruction to change the data of the computational system is determined. In order to form a real coil, such as a gradient magnetic field coil 3 or the like, wires, such as crossover wires and a return wire in a coil, a current supply wire between coils, and the like are to be added to this coil pattern of plural turns. As described on step S2, in a case that a coil pattern has been designed taking into account in advance magnetic fields caused by wires and the like, absence of an instruction to change the data of the computational system is determined (step S9, absence), and the present design method is terminated. In case the coil pattern formed in step S8 is used and this flowchart is again executed to add wires, such as crossover wires and a return wire in a coil, a current supply wire between coils, and the like, to this coil pattern, presence of an instruction to change the data of the computational system is determined (step S9, presence), and the process returns to step S1 to change the data of the computational system, and then proceeds to step S10 by determination in step S6 after steps S2-S5.

In step S10, based on the above-described approximated value T1' computed in step S5 in the current loop, displacement amount of the coil pattern is computed. Concretely, based on the current potential vector ($RT_1'$) at all nodes that correspond to adjustment current components (refer to Equation (12)), displacement $T/(\nabla T_0)$ of the conductor position from the original coil pattern is computed, using Equation $T/(\nabla T_0) = RT_1'/(\nabla T_0)$. Incidentally, a current density vector j can be computed (($\nabla T) \times n = j$) by a vector product between the gradient ($\nabla T$) of current potential and a unit vector n normal to the current carrying surface, and (Ic/d) computed from the distance d between conductors of the coil pattern and the conductor current (current density vector) Ic is equivalent to the gradient ($\nabla T$) of the current potential.

Subsequent to execution of step S10, the process proceeds to step S8 to form a coil pattern displaced by the above-described displacement amount.

The computation procedure of the current potential of a single current carrying surface has been described above. An actual gradient magnetic field coil 3 has two current carrying surfaces 20a and 20b of the y-direction gradient-magnetic-field main coil (first coil) yGMC for generating a gradient magnetic field and the y-direction gradient-magnetic-field shield coil (second coil) yGSC having a role of magnetic shield. Accordingly, coil patterns are designed, using the process by the flowchart in FIG. 6.

First, in step S1, using a general purpose computer or the like, data of a computational system is created. Step S1 in FIG. 6 executes basically the same as step S1 in FIG. 5, and step S1 in FIG. 6 is different from step S1 in FIG. 5 in that two current carrying surfaces 20a and 20b described above and two magnetic field evaluation surfaces 20c and 20d described above are created.

Subsequent Step S2 in FIG. 6 also executes basically the same as step S2 in FIG. 5. In step S2, using a general purpose computer or the like, target magnetic field $B_{tg}$ and weighting values w are set by input for the respective magnetic field evaluation points on the magnetic field evaluation surfaces 20c and 20d. Further, weighting values $w_T$ are set for respective elements $T_i$ of the current potential vectors T at the nodes of the finite surface elements of the current carrying surfaces 20a and 20b. Concretely, weighting values $w_T$ are set for the respective finite surface elements of the current carrying surfaces 20a and 20b. Similarly to step S2 in FIG. 5, if a known magnetic field exists, it is also taken into account. Particularly, incase of computing the current potential vector T for the y-direction gradient-magnetic-field shield coil (second coil) yGSC, it is essential to take into account a magnetic field generated by the y-direction gradient-magnetic-field main coil (first coil) yGMC. Further, wires, such as crossover wires and a return wire in a coil, a current supply wire between coils, and the like, which are known, are also taken into account.

Step S3 in FIG. 6 also executes basically the same as step S3 in FIG. 5. In step S3, using a general purpose computer or the like, from the current potential vectors T of the respective current carrying surfaces 20a and 20b, response matrices A to respective magnetic field vectors B of the magnetic field evaluation surfaces 20c and 20d and transformation matrices R are obtained, then singular value decomposition is executed, and singular values $\lambda_1, \lambda_2, \lambda_3$, an eigen vector group $(u_1, u_2, u_3)$ of magnetic field distribution, and an eigen vector group $(v_1, v_2, v_3)$ of current potential are obtained for each of the response matrices A.

In step S11, using a general purpose computer or the like, Steps S4 to S7 in FIG. 5 are executed on the current carrying surface 20a of the y-direction gradient-magnetic-field main coil (first coil) yGMC. In the process in step S4, it is necessary to determine a current potential vector T, also taking into account a magnetic field caused by a current in the y-direction gradient-magnetic-field shield coil (second coil) yGSC and a magnetic field by wires.

In step S12, using a general computer or the like, Steps S4 to S7 in FIG. 5 are executed on the current carrying surface 20b of the y-direction gradient-magnetic-field shield coil (second coil) yGSC. In the process in step S4, it is necessary to determine a current potential vector T, also taking into account a magnetic field caused by a current in the y-direction gradient-magnetic-field main coil (first coil) yGMC obtained in step S11 and a magnetic field by wires.

In step S8, using a general purpose computer or the like, current potential vectors T are adjusted according to Equation (12). Forming coil patterns based on the contours of the current potential vectors T is the same as step S8 in FIG. 5. Obtaining the contours and a coil pattern of the y-direction gradient-magnetic-field main coil (first coil) yGMC may be performed after step S11 or simultaneously with step S12.

In step S13, using a general purpose computer or the like, by evaluating the performances of target magnetic fields $B_{tg}$, inductances, resistors, and the like, it is evaluated whether or not the coil patterns can be implemented. If there is a problem with the performances, the process returns to step S1 to redesign a computational system (namely, coil arrangement regions and the like). If there is no problem with the performances (step S13, Yes), gradient magnetic field coil patterns are completed. For evaluation of the magnetic field performances on the magnetic field evaluation surfaces 20c and 20d, there are two methods, namely, evaluation with a discretized current where conductors are arranged along contours, and evaluation with a surface current (current distribution) represented by current potential before discretization, either evaluation being used depending on a purpose. As these methods are not based on a circulation current, arbitrary current distribution can be computed within a range allowed by the size of elements.

Herein, weighting values (permissible error) w, described on step S2, on magnetic field distribution will be described in detail. Introducing weighting values w is equivalent to conversion of variables of data at respective points (respective elements of a magnetic field vector B) in magnetic field distribution. That is, the magnetic field vector B in Equation (1) and Equation (3) described above becomes the difference (difference target magnetic field) $B_1$ obtained by Equation (9) described above. Discussing a weighting value $w_i$ for an element (magnetic field at a magnetic field evaluation point on a magnetic field evaluation surface) $B_i$ of the difference target magnetic field (vector) $B_1$, weighting of the element $B_i$ can be carried out by replacing (variable transformation) the element $B_i$ by $B_i/w_i$, as represented by Equation (13).

$$B_i \to B_i/w_i \quad (13)$$

Herein, the suffix i represents that the element $B_i$ is the $i^{th}$ element $B_i$ of the difference target magnetic field (vector) $B_1$. The weighting value $w_i$ is the $i^{th}$ weighting value (permissible error) of the element $B_i$. Similarly to a least squares method, an element $B_i$ is required to have smaller $w_i$ for more accurate approximation. Accordingly, by making the values of w different between the magnetic field evaluation surface 20c and the magnetic field evaluation surface 20d, computation can be performed, matching the respective accuracies required for the difference target magnetic field (vector) $B_1$.

Further, weighting values (permissible variation width) $w_T$, described on step S2, on the current potential vector T will be described in detail. Weighting values $w_T$ are introduced, by allotting computation (B=AT) on the magnetic field at magnetic field evaluation points corresponding to the current potential at nodes as represented by Equation (1). Weighting values $w_T$ are taken as variable transformation similar to that in Equation (13). That is, as represented by Equation (14), by replacing (variable transformation) an element $T_i$ of the current potential vector T of Equation (1) described above by $T_i/w_{Ti}$, the element $T_i$ can be subjected to weighting.

$$T_i \to T_i/w_{Ti} \quad (14)$$

The weighting value $w_{Ti}$ at each node dependent on an independent node is increased or decreased corresponding to the size of the finite surface element that corresponds to the dependent node, and is added to the weighting value $w_{Ti}$ for the independent node. A weighting value $w_{Ti}$ can be taken as an amount proportional to a permissible variation width. That is, if a weighting value $w_{Ti}$ is a small value, the variation width of the element $T_i$ of the current potential vector T can be reduced even when computation is repeated in the loop of the flowchart. That is, in case that a certain region of a coil pattern is intended to be fixed as that at the time of the initial value $T_0$, for example, in case that optimization of pattern shape is not performed on wires, such as a return wire, a current supply wire, and the like, weighting values $w_{Ti}$, which are smaller than those in other regions, are set in the region of these wires. In case that adjustment is intended to crossover wires, weighting values $w_{Ti}$, which are larger than those in other regions, are set in the region where the crossover wires are arranged.

Further, a method for introducing flow-in and flow-out of a current to computation in setting the initial value $T_0$ in step S4 will be described. The current is represented by the difference in the current potential (the difference in the current potential vector between elements). As a current initial value, a difference in the current potential corresponding to the flow-in/flow-out current at a flow-in/flow-out position is set for the current potential vector T. The current potential distribution corresponding to the flow-in/flow-out is input to the nodes at an end portion. That is, current potentials which are not constant at the end portion of a current carrying surface are input as elements of the initial value $T_0$. This is applicable to a case that the two magnetic field evaluation surfaces 20c and 20d are connected with wires and a current flows in and out between the magnetic field evaluation surfaces. It is necessary to input the elements of the initial value $T_0$ such that the flow-out and flow-in of a current at the end portions of the current carrying surfaces 20a and 20b agree with each other.

By the above-described method for designing coil pattern, regardless of the cross-sectional shapes of the tube shapes of the y-direction gradient-magnetic-field main coil yGMC and the y-direction gradient-magnetic-field shield coil yGSC, a gradient magnetic field 9 with high accuracy is formed in the image capturing region 8 by the y-direction gradient-magnetic-field main coil yGMC. Further, magnetic field lines, which are consequently formed and would penetrate the static-magnetic-field coil device 2 and thus generate eddy currents, are bent by the y-direction gradient-magnetic-field shield coil yGSC so as not to penetrate the static-magnetic-field coil device 2. Thus, generation of eddy currents can be reduced. Once again, it will be emphasized that, by this method for designing coil pattern, the cross-sectional shapes of the tube shapes of the y-direction gradient-magnetic-field main coil yGMC and the y-direction gradient-magnetic-field shield coil yGSC are arbitrary, because this method is based on the finite element method. That is, the cross-sectional shape of the tube shape of the y-direction gradient-magnetic-field main coil yGMC is not limited to an ellipse or a circle, and the cross-sectional shape of the tube shape of the y-direction gradient-magnetic-field shield coil yGSC is not limited to a circle that is along the inner circumferential wall of the static-magnetic-field coil device 2.

By the above-described method for designing coil pattern, once an initial value $T_0$ of a current potential vector is given (The zero vector may be given.), adjustment of the initial value $T_0$ is repeated in computation to thereby converge.

FIG. 10 shows the coil pattern (the contours of current potential distribution in FIG. 10(a)) of the y-direction gradient-magnetic-field main coil yGMC and the coil pattern (the contours of current potential distribution in FIG. 10(b)) of the y-direction gradient-magnetic-field shield coil yGSC, the coil patterns being designed by the above-described method for designing coil pattern, in a case that the both cross-sectional shapes of the y-direction gradient-magnetic-field main coil yGMC and the y-direction gradient-magnetic-field shield coil yGSC are circular. These contours of current potential are drawn at equal intervals being the interval of a current value that agrees with a current from a power source, in other words, a coil wire current value. Coils that generate a target magnetic field can be formed by arranging conductors along these contours. Crossover wires connecting wound wires, return wires, current supply wires from the power source, wires connecting the main coil and the shield coil or the like, are present, however, they are not shown here. The coil pattern (the contours of current potential distribution) of the x-direction gradient-magnetic-field main coil xGMC can be obtained similarly to the case of the coil pattern (the contours of current potential distribution in FIG. 10(a)) of the y-direction gradient-magnetic-field main coil yGMC, and is a pattern for which the rotational direction angle around z-axis is shifted with rotation by 90 degrees around z-axis. Likewise, the coil pattern (the contours of current potential distribution) of the x-direction gradient-magnetic-field shield coil xGSC can be obtained similarly to the case of the coil pattern (the contours of current potential distribution in FIG. 10(b)) of the y-direction gradient-magnetic-field shield coil yGSC, and is a pattern for which the rotational direction angle around z-axis is shifted with rotation by 90 degrees around z-axis.

Figure 11:
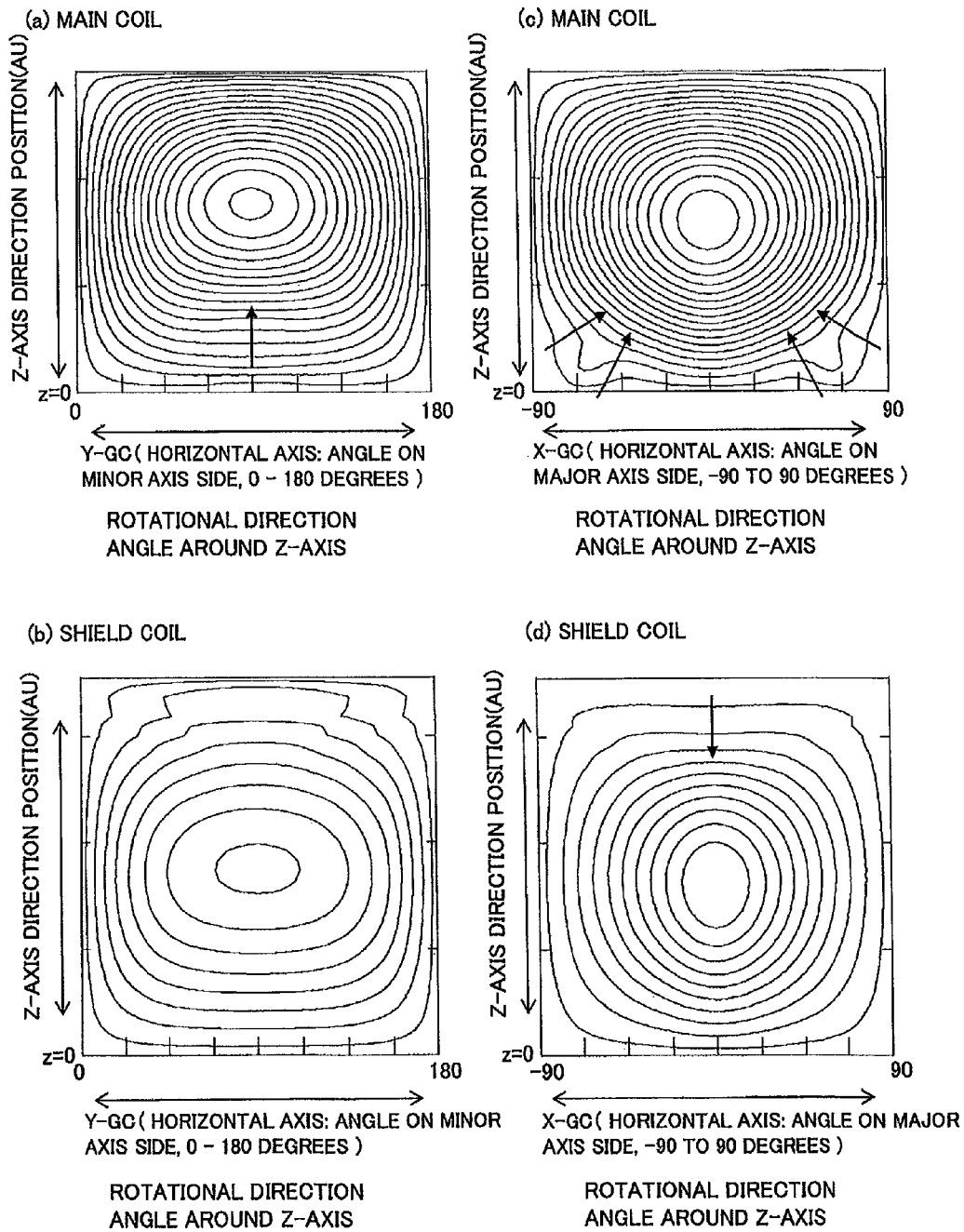

FIG. 11 shows the below-described coil patterns designed by the above-described method for designing coil pattern, in a case that the cross-sectional shapes of the y-direction gradient-magnetic-field main coil yGMC and the x-direction gradient-magnetic-field main coil xGMC are elliptical, while the cross-sectional shape of the y-direction gradient-magnetic-field shield coil yGSC and the x-direction gradient-magnetic-field shield coil xGSC are circular. FIG. 11 shows the coil pattern (contours of the current potential distribution in FIG. 11(a)) of the y-direction gradient-magnetic-field main coil yGMC, the coil pattern (contours of the current potential distribution in FIG. 11(b)) of the y-direction gradient-magnetic-field shield coil yGSC, the coil pattern (contours of the current potential distribution in FIG. 11(c)) of the x-direction gradient-magnetic-field main coil xGMC, and the coil pattern (contours of the current potential distribution in FIG. 11(d)) of the x-direction gradient-magnetic-field shield coil xGSC. Although crossover wires or a coil return wire are not shown in FIG. 10 or FIG. 11, such wires are actually present. That is, the whole coil patterns are in a spiral shape with crossover wires connecting turns, and a return wire from the center of the spiral is connected with another coil such as a coil from a power source or the like, however, description of these is omitted for easy understanding.

In comparison between the coil pattern of the y-direction gradient-magnetic-field main coil yGMC in FIG. 11(a) and the coil pattern of the y-direction gradient-magnetic-field main coil yGMC in FIG. 10(a), there is a difference between these two in that the coil pattern of the y-direction gradient-magnetic-field main coil yGMC in FIG. 10(a) has curvatures that are convex outward over the entire regions of the respective turns, while the coil pattern of the y-direction gradient-magnetic-field main coil yGMC in FIG. 11(a) has a portion with curvatures that are smoothly convex inward, the portion being generated on plural turns in the region that is close to z=0 and close to rotational direction angle of 90 degrees around z-axis. The region close to z=0 refers to the central side of the MRI device 1 with respect to the center of the spiral of the coil pattern. At the rotational direction angle of 90 degrees around z-axis, the minor axis portion of the ellipse is located. The y-direction gradient-magnetic-field main coil yGMC and the y-direction gradient-magnetic-field shield coil yGSC are the most distant from each other at the rotational direction angle of 90 degrees around z-axis. On the other hand, a region having a curvature convex inward is not recognized on the y-direction gradient-magnetic-field shield coil yGSC in FIG. 11(b) even compared with the case of the y-direction gradient-magnetic-field shield coil yGSC in FIG. 10(b). Incidentally, although sharply bent portions of turns are recognized in a region with a large |z| (on the end portion side of the MRI device 1 with respect to the center of the spiral), these are errors in computation, the errors reflecting finite elements. For an actual coil pattern, smooth connection may be made in a range of approximately three times the size of the mesh (finite surface elements) of these portions. A magnetic field that affects image capturing has effects only, approximately, in a range of the size of the mesh in a portion where wiring is changed; the generation region of eddy currents caused by the effects also is approximately in the width of the size of the mesh; and the region where the magnetic field caused by the eddy currents extends is also approximately within the range of the mesh. Accordingly, the magnetic field caused by the eddy currents does not reach the image capturing region, causing no problem with image capturing.

In comparison between the coil pattern of the x-direction gradient-magnetic-field main coil xGMC in FIG. 11(c) and the coil pattern of the y-direction gradient-magnetic-field main coil yGMC in FIG. 10(a), there is a difference between the two in that the coil pattern of the y-direction gradient-magnetic-field main coil yGMC in FIG. 10(a) has curvatures that are convex outward over the entire regions of the respective turns, while the x-direction gradient-magnetic-field main coil xGMC in FIG. 11(c) has portions with curvatures that are smoothly convex inward, the portions being generated on plural turns in the regions that are close to z=0 and have respective ranges of rotational direction angle 90 to 45 degrees and −90 to −45 degrees around z-axis.

In comparison between the x-direction gradient-magnetic-field shield coil xGSC in FIG. 11(d) and the y-direction gradient-magnetic-field shield coil yGSC in FIG. 10(b), there is a difference between the two in that the x-direction gradient-magnetic-field shield coil xGSC in FIG. 11(d) has a portion with curvatures that are smoothly convex inward, the portion being generated on plural turns in the region where |z| (on the end portion side of the MRI device 1 with respect to the center of spiral) is large and the rotational direction angle around z-axis is approximately zero degree. Incidentally, at the rotational direction angle of 0 degree around z-axis, the major axis portion of the ellipse is located. The x-direction gradient-magnetic-field main coil xGMC and the x-direction gradient-magnetic-field shield coil xGSC are the closest from each other at the rotational direction angle of zero degree around z-axis.

This characteristic of inner convex curvatures is recognized in FIG. 11, but is not necessarily recognized if a main coil has a small elliptical degree and is approximately in a circular shape. However, two other characteristics will be pointed out below.

The number of winding times (the number of turns) of a coil is different between xGC and yGC. The difference between the maximum value and the minimum value of current potential values is different between xGC and yGC. These are characteristics that conventional gradient magnetic field coils in a circular cross-section do not have. These characteristics are recognized particularly in shield coils. The coil yGSC in FIG. 11(b) has 9 turns, while the coil yGSC in FIG. 11(d) has 11 turns. In FIG. 11, the two main coils have the same number of turns, however, the numbers of turns are in general not the same. It is appropriate to understand that a difference in the number of turns is a difference between the number of turns of a main coil and the number of turns of a shield coil. In FIG. 11, the difference in the number of turns is six for xGC, and eight for yGC. This is a result of obtaining coil patterns by a method according to the present invention, reflecting a system where the distance between a main coil and a shield coil is different depending on whether the coils are along x-direction or y-direction. This characteristic is also recognized with zGC, wherein a pattern tends to be one in which turns are sparsely disposed in y-direction.

The other characteristic is the shape of a pattern at the central portion of windings. Being patterns in substantially elliptical shapes, both the main coil and the shield coil of yGC extend along the width direction in the figure (namely, the circumferential direction of a cylindrical surface), while those of xGC are in shapes extending long along the axial direction (vertical direction in the figure). As an example, when the second turns from the centers are viewed, difference between horizontal wideness and vertical wideness can be recognized in these figures. Herein, the scale of the horizontal axis is approximately 1 to 1.5 m, and the vertical scale is approximately 0.6 to 0.7 m. It can be said that, particularly in the shape of the second turn of the shield coil, there is a significant difference (difference greater than or equal to 20%) in terms of the elliptical degree defined by the shape (circumferential width/axial direction width).

As an example of a computational system with finite surface elements created in step S1 of the method for designing coil pattern, FIG. 12(a) shows a case of setting the cross-sectional shape of the current carrying surface 20a of the y-direction gradient-magnetic-field main coil yGMC substantially to a triangle, the cross-sectional shape being perpendicular to z-axis direction. As a similar example, FIG. 12(b) shows a case of setting the cross-sectional shape of the current carrying surface 20a of the y-direction gradient-magnetic-field main coil yGMC substantially to a quadrangle, the cross-sectional shape being perpendicular to z-axis direction. The arbitrariness of the cross-sectional shape (X-Y cross-section) of the current carrying surface 20a of the y-direction gradient-magnetic-field main coil yGMC has already been described above. Corresponding to the arbitrariness, a coil pattern can be designed with a cross-section in a shape such as a substantial triangle shown in FIG. 12(a), a substantial quadrangle shown in FIG. 12(b), or the like. As a method for designing coil pattern, the method for designing coil pattern described in the flowcharts in FIGS. 5 and 6 can be used. Incidentally, the edges of the cross-sectional triangle or the cross-sectional quadrangle of the current carrying surface 20a are made round herein, however, the method for designing coil pattern described in the flowcharts in FIGS. 5 and 6 can be used, independently from the shapes in terms of presence/absence of these arcs, these radii, and the like. Further, if the cross-sectional shape of the current carrying surface 20a of the y-direction gradient-magnetic-field main coil yGMC is an ellipse, a substantial triangle, or a substantial quadrangle, as it is possible to employ a shape suitable for a cross-sectional shape of a human body with a shoulder-width larger than a chest-thickness, a patient subject can have a feeling of relaxation. Further, for the current carrying surface 20b corresponding to the y-direction gradient-magnetic-field shield coil yGSC, assuming the static-magnetic-field coil device (magnet) 2 with the bore 2f with a circular cross-section (refer to FIG. 7), the cross-sectional shape (x-y plane) perpendicular to the static magnetic field direction 7 (same as the z-axis direction) is made circular. The difference in the number of turns pointed out with reference to FIG. 11 is also likewise recognized in the system in this FIG. 12. Particularly, regarding the system in FIG. 12, as there is a difference in the system between the upper portion and the lower portion even in yGC, there is difference in the number of turns occurs not only between xGC and yGC but also between upper yGC and lower yGC.

FIG. 13 shows the coil pattern (the contours of the current potential distribution in FIG. 13(a)) of the y-direction gradient-magnetic-field main coil yGMC and the coil pattern (the contours of the current potential distribution in FIG. 13(b)) of the y-direction gradient-magnetic-field shield coil yGSC in a case that designing is performed by the above-described method for designing coil pattern; the cross-sectional shape of the y-direction gradient-magnetic-field main coil yGMC is substantially a quadrangle; and the cross-sectional shape of the y-direction gradient-magnetic-field shield coil yGSC is circular, while FIG. 13(c) shows the position relationship between the current carrying surface 20a of the y-direction gradient-magnetic-field main coil yGMC and the current carrying surface 20b of the y-direction gradient-magnetic-field shield coil yGSC.

In comparison between the coil pattern of the y-direction gradient-magnetic-field main coil yGMC in FIG. 13(a) and the coil pattern of the y-direction gradient-magnetic-field main coil yGMC in FIG. 10 (a), there is a difference between the two in that the coil pattern of the y-direction gradient-magnetic-field main coil yGMC in FIG. 10(a) has curvatures that are convex outward over the entire regions of the respective turns, while the y-direction gradient-magnetic-field main coil yGMC in FIG. 13(a) has portions with curvatures that are smoothly convex inward, the portions being generated on plural turns in the regions that are close to z=0 and have respective ranges of rotational direction angle substantially 0 to 45 degrees and substantially 135 to 180 degrees around z-axis, and on plural turns in the regions that are of large |z| (the end portion side of the MRI device 1 with respect to the center of the spiral) and have respective ranges of rotational direction angle substantially 22.5 to 45 degrees and substantially 135 to 157.5 degrees around z-axis.

In comparison between the coil pattern of the y-direction gradient-magnetic-field shield coil yGSC in FIG. 13(b) and the coil pattern of the y-direction gradient-magnetic-field shield coil yGSC in FIG. 10 (b), there is a difference between the two in that the coil pattern of the y-direction gradient-magnetic-field shield coil yGSC in FIG. 13(b) has portions with curvatures that are smoothly convex inward, the portions being generated on plural turns in the regions that are of large |z| (the end portion side of the MRI device 1 with respect to the center of the spiral) and have respective ranges of rotational direction angle substantially 0 to 70 degrees and substantially 110 to 180 degrees around z-axis. Incidentally, as shown in FIG. 13(c), the current carrying surfaces 20a and 20b are the closest to each other in the region of rotational direction angle 45 to 135 degrees around z-axis, and it is understood that the portions with curvatures that are convex inward are generated at a part of the above-described turns, corresponding to this position relationship. Accordingly, it is recognized that, by the above-described method for designing coil pattern, coil patterns can be designed, taking into account such a phenomenon.

As an example of a computational system with finite surface elements created in step S1 of the method for designing coil pattern, FIG. 14(a) shows a case of setting the end portion 20e, with respect to z-axis direction, of the current carrying surface 20a of the y-direction gradient-magnetic-field main coil yGMC to a circular truncated cone, and FIG. 14(b) shows a cross-sectional view of the MRI device 1 provided with this y-direction gradient-magnetic-field main coil yGMC. The shape of the x-y cross-section of the current carrying surface 20a of the y-direction gradient-magnetic-field main coil yGMC changes along z-axis direction, and at the end portion 20e of the current carrying surface 20a, the larger |z| is, the more distant from z-axis and the closer to the current carrying surface 20b the current carrying surface 20a is. Such a shape can reduce a magnetic field leaking from the end portion of the gradient magnetic field coil 3, and reduce a magnetic field generated by eddy currents caused by such a leaking magnetic field, which is an advantage of enabling satisfactory image capturing.

FIG. 15 shows the coil pattern (the contours of the current potential distribution in FIG. 15(a)) of the y-direction gradient-magnetic-field main coil yGMC and the coil pattern (the contours of the current potential distribution in FIG. 15(b)) of the y-direction gradient-magnetic-field shield coil yGSC in a case that designing is performed by the above-described method for designing coil pattern and the end portion 20e, with respect to z-axis direction, of the current carrying surface 20a of the y-direction gradient-magnetic-field main coil yGMC is set to a circular truncated cone.

In comparison between the coil pattern of the y-direction gradient-magnetic-field main coil yGMC in FIG. 15(a) and the coil pattern of the y-direction gradient-magnetic-field main coil yGMC in FIG. 10(a), there is a difference between the two in that the coil pattern of the y-direction gradient-magnetic-field main coil yGMC in FIG. 10(a) has curvatures that are convex outward over the entire regions of the respective turns, while the y-direction gradient-magnetic-field main coil yGMC in FIG. 15(a) has portions with curvatures that are smoothly convex inward, the portions being generated on plural turns in the regions that are close to z=0 and have respective ranges of rotational direction angle substantially 0 to 70 degrees and substantially 110 to 180 degrees around z-axis, and on plural turns in the region that is of large |z| (the end portion side of the MRI device 1 with respect to the center of the spiral) and has a rotational direction angle substantially of 90 degrees around z-axis.

In comparison between the coil pattern of the y-direction gradient-magnetic-field shield coil yGSC in FIG. 15(b) and the coil pattern of the y-direction gradient-magnetic-field shield coil yGSC in FIG. 10(b), there is a difference between the two in that the coil pattern of the y-direction gradient-magnetic-field shield coil yGSC in FIG. 15(b) has a portion with curvatures that are smoothly convex inward, the portion being generated on plural turns in the region that is of large |z| (the end portion side of the MRI device 1 with respect to the center of the spiral) and has a rotational direction angle substantially of 90 degrees around z-axis. Further, compared with the foregoing patterns, it is a more significant characteristic that, the closer to the outer circumferential portion, the axial direction position (z-direction position) with the maximum width with respect to width direction position is located at a large z-direction position.

Second Embodiment

In the first embodiment, a method for designing plural coil turns of a coil pattern/coil patterns has been described. In a second embodiment, a method for designing coil pattern including crossover wires connected to plural turns, a return wire, and a current supply wire will be described. A current that flows in crossover wires, a return wire, and a current supply wire is understood to generate an error magnetic field. It is understood that there are cases where such an error magnetic field generates eddy currents on a static-magnetic-field coil device 2, and these eddy currents form a magnetic field that degrades a cross-sectional image in an image capturing region. Accordingly, it is important to reduce generation of eddy currents, on the static-magnetic-field coil device 2, which would be generated by an error magnetic field generated by a current that flows in the crossover wires, the return wire, and the current supply wire.

As shown in FIG. 16(a), by arranging crossover wires 14 for connecting plural turns 12 and a return wire 13 to be connected with the inner turn of the plural turns 12 that are disposed in multiplication and to be led to outside such that the crossover wires 14 and the return wire 13 are superposed with each other, it is possible to cancel error magnetic fields, by each other, respectively generated from them to thereby reduce eddy currents. Further, using the method for designing coil pattern described with reference to the flowchart in FIG. 5, a coil pattern with an improved accuracy of cancelling error magnetic fields with each other will be provided.

The current component of crossover wires 14 is understood to a combination of the component in the circumferential direction of the turns 12 for generating an intended magnetic field along the turns 12, the component being along the turns 12, and a component in a direction perpendicular to the circumferential direction, the component generating an error magnetic field. In this situation, it is possible to reduce the error magnetic field by arranging a return wire 13 having a current component in a direction opposite to the direction of the current component of the crossover wires 14 that generates the error magnetic field such that the return wire 13 is close to these crossover wires 14. The width W1 represents the width of the crossover wires 14, the width being along the circumferential direction of the turns 12, wherein the bent portions between the turns 12 and the crossover wires 14 are boundaries between the turns 12 and the crossover wires 14.

However, the structure where the return wire 13 is arranged close to these crossover wires 14 has the following drawback. As it is impossible to arrange this return wire 13 on the same surface as the coil surface, this error magnetic field cannot be completely cancelled. For a coil in requirement for high accuracy of magnetic field such as to be used for the MRI device 1, this error magnetic field that remains without being canceled generates eddy currents to cause a problem with image capturing. Referring to FIG. 17(a), the mechanism of generating this problem will be described below. The crossover wires 14 are present on the coil surface, and the return wire 13 is arranged between the crossover wires 14 (coil surface) and the vacuum vessel 2c of the static-magnetic-field coil device 2. Magnetic field lines leak from between the superposition of the return wire 13 and the crossover wires 14, extend with a curve toward the conductive surface of the vacuum vessel 2c, and penetrate the conductive surface of the vacuum vessel 2c. The magnetic field lines penetrating the conductive surface generate eddy currents, and the eddy currents generate an undesired magnetic field. It is necessary to eliminate or reduce this magnetic field. This problem is significant particularly with the crossover wires 14 of the y-direction gradient-magnetic-field shield coil yGSC arranged close to the vacuum vessel 2c and the return wire 13. This problem is particularly significant with a coil laminated at the outermost circumferential portion of a laminated gradient magnetic field coil. Herein, it is assumed that yGSC is laminated on the outermost circumference, as shown in FIG. 3.

In this situation, the position relationship between the crossover wires 14 and the return wire 13 will be discussed in the following two cases. In one case, as shown in FIG. 17(a), the return wire 13 and the crossover wires 14 are arranged in this order when viewed from the vacuum vessel 2c. In the other case, as shown in FIG. 17(b), the crossover wires 14 and the return wire 13 are arranged in this order when viewed from the vacuum vessel 2c. Compared with the case of the arrangement shown in FIG. 17(a), in the case of the arrangement shown in FIG. 17(b), it is understood that magnetic field lines hardly penetrate the conductive surface of the vacuum vessel 2c and eddy currents are hardly generated, because the crossover wires 14 wider than the return wire 13 guide the magnetic field lines, which leak from the superposition of the return wire 13 and the crossover wires 14, along the crossover wires 14 to make the magnetic field lines hardly curve toward the conductive surface of the vacuum vessel 2c.

First, described will be a method for designing coil pattern of a y-direction gradient-magnetic-field shield coil yGSC that enables making generation of eddy currents hard in a case of arrangement of the return wire 13 and the crossover wires 14 in this order in a view from the vacuum vessel 2c as shown in FIG. 17(a). As a method for designing coil pattern here, the method for designing coil pattern described in the flowchart in FIG. 5 can be used.

First, in step S1, data of a computational system is created. Similarly to step S1 in the first embodiment, it is emphasized that, as the coil surface (current carrying surface), a current carrying surface 20b where the y-direction gradient-magnetic-field shield coil yGSC is arranged is set.

In step S2, a target magnetic field Btg and a weighting value w are set by input for each magnetic field evaluation point of the magnetic field evaluation surfaces 20c and 20d. Similarly to the first embodiment, attention should be paid that, as a coil pattern of the y-direction gradient-magnetic-field main coil yGMC has been already obtained and it is possible to compute a magnetic field generated by this coil pattern, the magnetic field generated on the magnetic field evaluation surface 20d by the y-direction gradient-magnetic-field main coil yGMC is subtracted from the target magnetic field Btg, and the magnetic field Btg after the subtraction is set as a new target magnetic field Btg.

Figure 18:
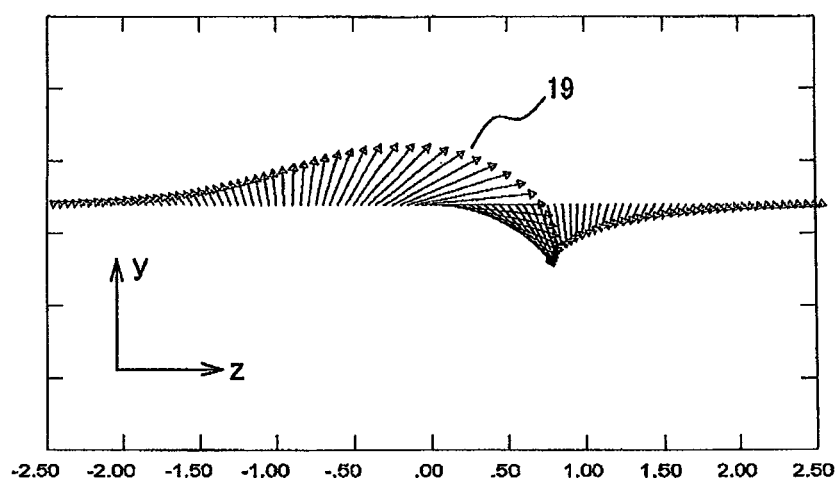
FIG. 18 is a distribution diagram of an error magnetic field component that is formed on the static-magnetic-field coil device in a case that the return wire is arranged on the side of the static-magnetic-field coil device with respect to the crossover wires.

Further attention should be paid to that, as the arrangement positions of the crossover wires 14 and the return wire 13 and a current to be made flow through the arrangement positions are already known, magnetic fields generated by this current on the magnetic field evaluation surfaces 20c and 20d can be computed. FIG. 18 shows magnetic fields (error magnetic fields) generated by the crossover wires 14 and the return wire 13 on the magnetic field evaluation surface 20d. Arrows 19 in FIG. 18 represent the directions and the strengths of the magnetic fields, wherein the direction of a magnetic field is facing upward or downward a little or more in the figure, the arrow 19 represents that the magnetic field line penetrates the magnetic field evaluation surface 20d. In this situation, this magnetic field (error magnetic field) is subtracted from the corresponding target magnetic field Btg, and the target magnetic field Btg after the subtraction is newly set as a target magnetic field Btg.

Still further, attention should be paid to that, as shown in FIG. 18, a region where an error magnetic field is generated on the magnetic field evaluation surface 20d can be recognized, and accordingly a weighting value w is set smaller in this region than in the other regions. Thus, the computation accuracy in this region is increased, by which the entire computation accuracy is increased.

Further, in step S2, similarly to the first embodiment, a weighting value wT is set for each element Ti of the current potential vector T at the nodes of the finite surface elements of the current carrying surfaces 20b. Concretely, a weighting value wT is set for each finite surface element of the current carrying surface 20b. In this situation, attention should be paid to that the turns 12 and the return wire 13 are not to be adjusted but only the crossover wires 14 are to be adjusted. Weighting values wTi are set larger in the region where the crossover wires 14 are arranged than in other regions so that only the crossover wires 14 are thereby adjusted.

Step S3 is similar to that in the first embodiment, and may be omitted for reuse of the previous result as it is.

In step S4, the initial value T0 of the current potential vector T is set, similarly to the case of the first embodiment, however, attention should be paid to that the current potential vector T corresponding to the turns 12 is set as the initial value T0. Concretely, a current potential vector T, based on which the coil pattern of a gradient magnetic field coil has been once completed by a design method according to the present invention, is set as the initial value T0.

Step S5 is similar to that in the first embodiment, and the approximated value T1' of the current potential vector at the independent nodes that generate a difference target magnetic field B1 is determined.

In step S6, determined is presence or absence of a coil pattern based on which the initial value T0 of the current potential vector T has been set. As adjustment of an existing coil pattern is performed (step S6, Yes), the process proceeds to step S10.

In step S10, based on the above-described approximated value T1', displacement amount of the coil pattern is computed. Adjustment currents (for the displacement amount of the coil pattern) 18a and 18b, shown in FIG. 16(b), can be computed, based on the approximated value T1' of the current potential vector. The adjustment currents 18a and 18b are loop currents. The current direction of the adjustment current 18a is counterclockwise (valley), while the current direction of the adjustment current 18b is clockwise (peak).

Subsequent to executing step S10, the process proceeds to step S8, and forms a coil pattern displaced with the displacement amount. It is recognized that the crossover wires 14 intersecting with the return wire 13 are serpentine. According to the above-described method for designing coil pattern, a target magnetic field Btg is set, taking into account not only a magnetic field generated by the y-direction gradient-magnetic-field main coil yGMC but also error magnetic fields generated by the crossover wires 14 and the return wire 13 of the y-direction gradient-magnetic-field shield coil yGSC, so that these magnetic fields are cancelled. As a shield coil pattern is computed in such a manner, magnetic shield can be attained also against the error magnetic fields. In the case of the return wire 13 and the crossover wires 14, intersecting with the return wire 13, of the y-direction gradient-magnetic-field main coil yGMC, although the serpentine degree is small as these wires are distant from the magnetic field evaluation surface 20d having the problem of eddy currents, a pattern change is performed in a qualitatively similar manner.

Next, described will be a method for designing coil pattern of a y-direction gradient-magnetic-field shield coil yGSC that enables making generation of eddy currents hard in a case of arrangement of the crossover wires 14 and the return wire 13 in this order in a view from the vacuum vessel 2c as shown in FIG. 17(b). As a method for designing coil pattern here, the method for designing coil pattern described in the flowchart in FIG. 5 can be used, however, may be not used. It is also possible to change a pattern, based on the above-described adjustment of current potential, however, a simple adjustment method will be described below.

FIG. 19 shows distribution of the error magnetic field component on the vacuum vessel 2c of the static-magnetic-field coil device 2 generated by the return wire 13 and the crossover wires 14 in a case where the return wire 13 is arranged on the side opposite to the static-magnetic-field coil device 2 with respect to the crossover wires 14. FIG. 19(a) shows a case where the ratio of the crossover width W3 (refer to FIG. 17(b)) to the width W4 of the return wire 13 (refer to FIG. 17(b)) is 4 times, FIG. 19(b) shows a case where the ratio of the crossover width W3 to the width W4 of the return wire 13 is 6 times, FIG. 19(c) shows a case where the ratio of the crossover width W3 to the width W4 of the return wire 13 is 8 times, and FIG. 19(d) shows a case where the ratio of the crossover width W3 to the width W4 of the return wire 13 is 10 times. While the ratio of the crossover width W3 to the width W4 of the return wire 13 is changed starting from 4 times to 10 times, the strength of the error magnetic fields gradually changes, and the error magnetic field becomes weak with the ratio around 4-10 times, and preferably around 6-8 times in the present case. This optimum position changes with the position relationship, and an appropriate range, in which the ratio of the crossover width W3 to the width W4 of the return wire 13 is changed, is between 4 times and 10 times.

Finally, a method of reducing an error magnetic field generated from a current supply wire 11 for a coil shown in FIG. 20(a) will be described below. The current supply wire 11 and a return wire 13 form a pair of forward and backward wires. Respective error magnetic fields are canceled with each other due to the forward and backward directions, and the total error magnetic field is thereby reduced. However, the error magnetic fields cannot be completely eliminated due to the difference in position between the forward and backward current wires. In this situation, a method for designing coil pattern will be described below, wherein the method is capable of further reducing error magnetic fields even with a y-direction gradient-magnetic-field shield coil yGSC having a coil pattern shown in FIG. 20(a). As a method for designing coil pattern here, the method for designing coil pattern described in the flowchart in FIG. 5 can be used. Incidentally, the current supply wire 11 is assumed to be on the same side as the return wire 13 with respect to the turns 12.

First, in step S1, a computational system is created. This can be executed similarly to the case in FIG. 16.

In step S2, target magnetic fields Btg and a weighting value w for each magnetic field evaluation point of the magnetic field evaluation surfaces 20c and 20d are set by input. Similarly to the case of FIG. 16, attention should be paid to that, as the positions where the current supply wire 11 and the return wire 13 are arranged and a current that is made flow there are known, it is possible to compute magnetic fields generated by the currents on the magnetic field evaluation surfaces 20c and 20d. A thus computed magnetic field (error magnetic field) is subtracted from the target magnetic field Btg, and the target magnetic field Btg after the subtraction is newly set as a target magnetic field Btg.

Further, in step S2, similarly to the case of FIG. 16, A weighting value wT is set for each finite surface element of the current carrying surface 20b. In this situation, attention should be paid to that only the region of a portion, of the turns 12, that intersects with the current supply wire 11 and the return wire 13 is adjusted. The circumferential width W2, of the turns 12, in this region is set larger than the distance between the current supply wire 11 and the return wire 13. In this region (W2), wTi are set larger than wTi in other regions so that the turns 12 are adjusted only in this region (W2).

Step S3 is similar to that in the first embodiment, and may be omitted for reuse of a previous result as it is.

In step S4, an initial value T0 of the current potential vector T is set, which can be executed similarly to the case of FIG. 16.

Step S5 is similar to that in the first embodiment, and the approximated value T1' of the current potential vector at independent nodes that generate a difference target magnetic field B1 is determined.

In step S6, determined is presence or absence of a coil pattern based on which the initial value T0 of the current potential vector T has been set. As adjustment of an existing coil pattern is performed (step S6, Yes), the process proceeds to step S10.

In step S10, based on the above-described approximated value T1', displacement amount of the coil pattern is computed. An adjustment current (for displacement amount of the coil pattern) 21, shown in FIG. 20(b), can be computed, based on the approximated value T1' of the current potential vector. The adjustment current 21 is a loop current. The current direction of the adjustment current 21 is clockwise (peak).

Subsequent to execution of step S10, the process proceeds to step S8, and, as shown in FIG. 20 (c), a coil pattern displaced with a computed displacement amount is formed. It is recognized that in the region (W2) where the turns 12 intersect with the current supply wire 11 and the return wire 13, the turns 12 are formed as adjustment wires that are curved with a bypass. According to the above-described method for designing coil pattern, a target magnetic field $B_{tg}$ is set, taking into account not only a magnetic field generated by the y-direction gradient-magnetic-field main coil yGMC but also error magnetic fields generated by the current supply wire 11 and the return wire 13 of the y-direction gradient-magnetic-field shield coil yGSC, so that these magnetic fields are cancelled. As a shield coil pattern is computed in such a manner, magnetic shield can be attained also against the error magnetic fields.

As has been described above, according to the present invention, a method is used that optimizes current potential distribution by representing current distribution by current potentials at finite element nodes so that a current on a current carrying surface generates an intended magnetic field. Accordingly, determination can be made so that eddy currents generated on a static magnetic field magnet structure are reduced for an arbitrary magnetic field. Accordingly, the invention is applicable to a main coil and a wiring pattern with an arbitrary cross-section. As a result, a gradient magnetic field coil/coils with an excellent image capturing performance with reduced eddy currents can be provided, and a nuclear magnetic resonance imaging device with an improved image capturing performance can be provided.

DESCRIPTION OF REFERENCE SYMBOLS

1 . . . nuclear magnetic resonance imaging (MRI) device
2 . . . static-magnetic-field coil device
2a . . . static-magnetic-field main coil
2b . . . static-magnetic-field shield coil
2c . . . vacuum vessel (conductor)
2d . . . heat radiation shield
2e . . . refrigerant vessel
2f . . . bore
3 . . . gradient magnetic field coil
4 . . . RF coil
5 . . . subject patient
6 . . . bed
8 . . . image capturing region
9 . . . gradient magnetic field
10 . . . symmetry axis
11 . . . current supply wire
12 . . . turn
13 . . . return wire
14 . . . crossover wire
15 . . . adjustment wire
16 . . . magnetic field line
18a, 18b . . . adjustment current
19 . . . direction and strength of magnetic field
20a, 20b . . . coil surface (current carrying surface)
20c, 20d . . . magnetic field evaluation surface
21 . . . adjustment current
GMC . . . gradient-magnetic-field main coil
xGMC . . . x-direction gradient-magnetic-field main coil
yGMC . . . y-direction gradient-magnetic-field main coil
zGMC . . . z-direction gradient-magnetic-field main coil
GSC . . . gradient-magnetic-field shield coil
xGSC . . . x-direction gradient-magnetic-field shield coil
yGSC . . . y-direction gradient-magnetic-field shield coil
zGSC . . . z-direction gradient-magnetic-field shield coil

The invention claimed is:

1. A gradient magnetic field coil, comprising:
a plurality of first gradient coils in a tube shape disposed along an axial direction, the first gradient coils including at least one first main coil generating a linear magnetic field distribution in an image capturing region of a nuclear magnetic resonance imaging device, and at least one first shield coil disposed outside of the first main coil and inside a static magnetic field coil device that generates a static magnetic field with a uniform magnetic field distribution in the image capturing region, the at least one first shield coil reducing a leakage magnetic field from the first main coil to the static magnetic field coil device; and
a plurality of second gradient coils in a tube shape disposed along the axial direction and inclined in a different direction than the first gradient coils, the second gradient coils including at least one second main coil generating a linear magnetic field distribution in the image capturing region of the nuclear magnetic resonance imaging device, and at least one second shield coil disposed outside the second main coil and inside the static magnetic field coil device that generates a static magnetic field with a uniform magnetic field distribution in the image capturing region, the at least one second shield coil reducing a leakage magnetic field that is from the second main coil to the static magnetic field coil device,
wherein a cross-section, of at least one of the first shield coil and the second shield coil, perpendicular to the axial direction is substantially circular,
wherein a cross-section, of at least one of the first main coil and the second main coil, perpendicular to the axial direction is not circular, and
wherein a number of turns is different between the first main coil and the second main coil and/or a number of turns is different between the first shield coil and the second shield coil.

2. The gradient magnetic field coil according to claim 1,
wherein at least one of the first main coil and the second main coil have turns in a spiral shape, and
wherein elliptical degrees of the respective turns of the at least one of the first main coil and the second main coil counted from respective centers thereof have a difference greater than or equal to 20%.

3. A nuclear magnetic resonance imaging device, comprising:
the gradient magnetic field coil according to claim 2,
wherein the static magnetic field coil device is arranged adjacent to the first gradient coils and the second gradient coils.

4. A nuclear magnetic resonance imaging device, comprising:
- the gradient magnetic field coil according to claim 1,
- wherein the static magnetic field coil device is arranged adjacent to the first gradient coils and the second gradient coils.

5. The gradient magnetic field coil according to claim 1,
- wherein cross-sections of the first main coil and the second main coil perpendicular to the axial direction are elliptical,
- wherein a first distance between the first main coil and the first shield coil is longer than a second distance between the second main coil and the second shield coil,
- wherein the first main coil and the second main coil have turns in a spiral shape, and
- wherein the number of turns of the second main coil is greater than the number of turns of the first main coil.

6. The gradient magnetic field coil according to claim 5,
- wherein the first main coil generates the linear magnetic field distribution in a horizontal direction and the second main coil generates the linear magnetic field distribution in a vertical direction.

7. A nuclear magnetic resonance imaging device, comprising:
- the gradient magnetic field coil according to claim 5,
- wherein the static magnetic field coil device is arranged adjacent to the first gradient coils and the second gradient coils.

* * * * *